United States Patent
Shimanuki

(10) Patent No.: US 10,090,237 B2
(45) Date of Patent: *Oct. 2, 2018

(54) SEMICONDUCTOR DEVICE AND MANUFACTURING METHOD THEREOF

(71) Applicant: Renesas Electronics Corporation, Koutou-ku, Tokyo (JP)

(72) Inventor: Yoshihiko Shimanuki, Gunma (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/727,510

(22) Filed: Oct. 6, 2017

(65) Prior Publication Data
US 2018/0040552 A1 Feb. 8, 2018

Related U.S. Application Data

(63) Continuation of application No. 15/359,611, filed on Nov. 22, 2016, now Pat. No. 9,812,388.

(30) Foreign Application Priority Data

Jan. 27, 2016 (JP) ................. 2016-013151

(51) Int. Cl.
*H01L 23/28* (2006.01)
*H01L 23/498* (2006.01)
(Continued)

(52) U.S. Cl.
CPC ...... *H01L 23/49861* (2013.01); *H01L 21/561* (2013.01); *H01L 21/565* (2013.01);
(Continued)

(58) Field of Classification Search
CPC ....... H01L 23/3107; H01L 2224/48247; H01L 2924/181; H01L 23/495; H01L 2224/97; H01L 23/49551; H01L 23/49555
(Continued)

(56) References Cited

U.S. PATENT DOCUMENTS 5,191,403 A * 3/1993 Nakazawa .......... H01L 23/3107
257/787
5,446,313 A * 8/1995 Masuda .............. H01L 23/3107
257/666
(Continued)

FOREIGN PATENT DOCUMENTS

JP H06-252318 A 9/1994
JP 2010-165777 A 7/2010

*Primary Examiner* — S. V. Clark
(74) *Attorney, Agent, or Firm* — Shapiro, Gabor and Rosenberger, PLLC

(57) ABSTRACT

A semiconductor device includes a die pad, a semiconductor chip with a bonding pad being formed, a lead one end of which is located in the vicinity of the semiconductor chip, a coupling wire that connects an electrode and the lead, and a sealing body that seals the semiconductor chip, the coupling wire, a part of the lead, and a part of the die pad. A lower surface of the die pad is exposed from a lower surface of the sealing body, the die pad and the coupling wire are comprised of copper, and a thickness of the semiconductor chip is larger than the sum of a thickness of the die pad and a thickness from an upper surface of the semiconductor chip to an upper surface of the sealing body.

11 Claims, 16 Drawing Sheets

(51) Int. Cl.
*H01L 23/495* (2006.01)
*H01L 21/56* (2006.01)
*H01L 23/00* (2006.01)

(52) U.S. Cl.
CPC .. *H01L 23/49513* (2013.01); *H01L 23/49548* (2013.01); *H01L 23/49555* (2013.01); *H01L 23/49582* (2013.01); *H01L 23/49838* (2013.01); *H01L 24/48* (2013.01); *H01L 24/49* (2013.01); *H01L 24/45* (2013.01); *H01L 2224/05554* (2013.01); *H01L 2224/05624* (2013.01); *H01L 2224/2929* (2013.01); *H01L 2224/29339* (2013.01); *H01L 2224/29347* (2013.01); *H01L 2224/32245* (2013.01); *H01L 2224/45015* (2013.01); *H01L 2224/4554* (2013.01); *H01L 2224/45147* (2013.01); *H01L 2224/4809* (2013.01); *H01L 2224/48091* (2013.01); *H01L 2224/48095* (2013.01); *H01L 2224/48101* (2013.01); *H01L 2224/48245* (2013.01); *H01L 2224/48247* (2013.01); *H01L 2224/48458* (2013.01); *H01L 2224/48465* (2013.01); *H01L 2224/48479* (2013.01); *H01L 2224/49171* (2013.01); *H01L 2224/73265* (2013.01); *H01L 2224/83101* (2013.01); *H01L 2224/92247* (2013.01); *H01L 2924/10253* (2013.01); *H01L 2924/1711* (2013.01); *H01L 2924/181* (2013.01); *H01L 2924/1811* (2013.01); *H01L 2924/1815* (2013.01); *H01L 2924/18301* (2013.01); *H01L 2924/20753* (2013.01); *H01L 2924/3511* (2013.01)

(58) Field of Classification Search
USPC ......... 257/787, 666, 676; 438/127, 123, 124
See application file for complete search history.

(56) References Cited

U.S. PATENT DOCUMENTS

| | | | | |
|---|---|---|---|---|
| 5,508,557 | A * | 4/1996 | Sunada | H01L 21/565 257/692 |
| 5,708,300 | A * | 1/1998 | Woosley | H01L 23/3121 257/730 |
| 6,084,309 | A * | 7/2000 | Kawashima | H01L 21/4835 257/666 |
| 6,388,338 | B1 * | 5/2002 | Romano' | B29C 37/005 257/664 |
| 6,750,080 | B2 * | 6/2004 | Masuda | H01L 24/48 257/676 |
| 9,812,388 | B2 * | 11/2017 | Shimanuki | H01L 23/49861 |
| 2014/0353836 | A1 * | 12/2014 | O'Sullivan | H01L 21/56 257/773 |

* cited by examiner

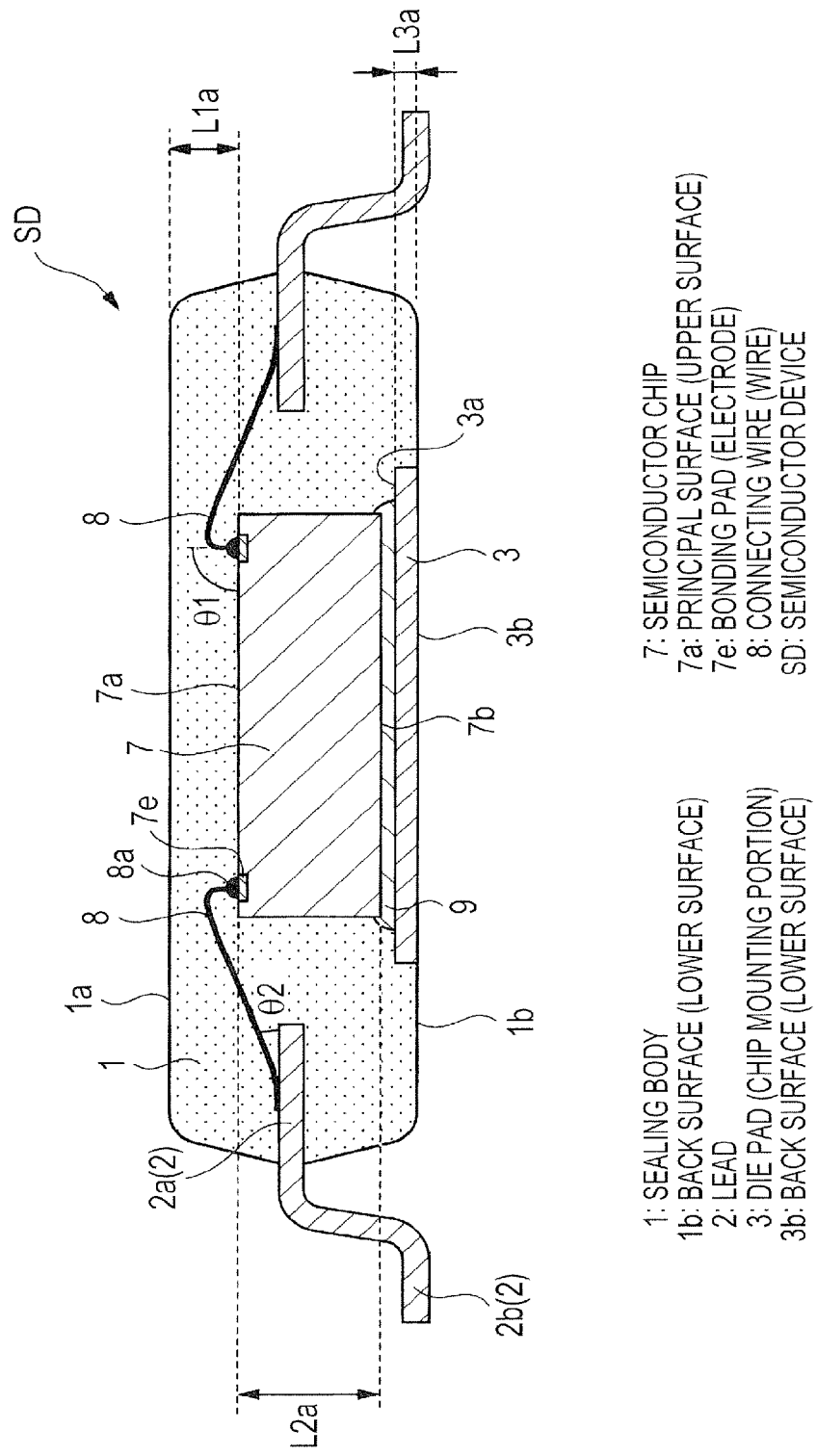

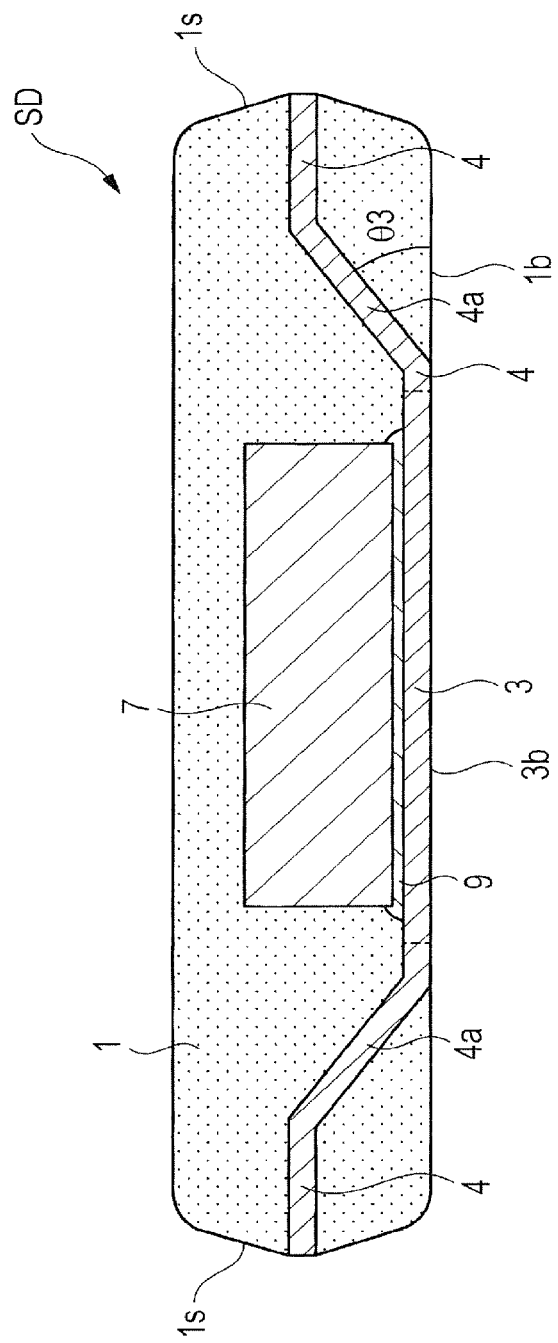

SEMICONDUCTOR DEVICE AND MANUFACTURING METHOD THEREOF

CROSS-REFERENCE TO RELATED APPLICATIONS

The disclosure of Japanese Patent Application No. 2016-013151 filed on Jan. 27, 2016 including the specification, drawings and abstract is incorporated herein by reference in its entirety.

BACKGROUND

The present invention relates to a technology that is effectively applied to, for example, a resin-sealed type semiconductor device that a die pad is exposed from a sealing body and a manufacturing method for the semiconductor device.

In each of Japanese Unexamined Patent Application Publication No. 2010-165777 and Japanese Unexamined Patent Application Publication No. H06-252318, a semiconductor device having a die pad that a semiconductor chip is mounted on and the die pad is exposed from a back surface of a sealing body is disclosed.

In Abstract of Japanese Unexamined Patent Application Publication No. 2010-165777, there is disclosed a technology for arranging a bus bar 1d such that a space between an inner lead 1a and the bus bar 1d becomes at least a space between the bus bar 1d and a mounting surface 3b of a sealing body 3 for the purpose of exposing the die pad from the sealing body.

In Abstract of Japanese Unexamined Patent Application Publication No. H06-252318, there is disclosed a technology for providing anchor arms 22 and 22A and anchor and press arms 23, 23A, 24 and 24A that extend from positions on a circumferential edge of a stage 2 obliquely upward for the purpose of preventing the stage from peeling off a resin package body.

SUMMARY

Recently, there has been a tendency that also an amount of heat (a heating value of a semiconductor chip) generated from the semiconductor chip is increased with functional upgrading and speeding-up of the semiconductor chip. Accordingly, the structure of the semiconductor device that the die pad has been exposed from the sealing body as described above is being examined as measures for heat radiation.

According to the examination made by the inventors and others of the present application, in the semiconductor device that the die pad has been exposed from the sealing body, it has been found that due to interfacial peeling that has occurred between the semiconductor chip and the die pad, the die pad and a sealing resin, a surface of the semiconductor chip and the sealing resin and so forth, cracks are generated in the semiconductor chip or the sealing body and the reliability of the semiconductor chip is reduced.

That is, it is requested to improve the reliability in the resin-sealed type semiconductor device that the die pad has been exposed from the sealing body.

Other subjects and novel features of the present invention will become apparent from the description of the present specification and the appended drawings.

According to one embodiment of the present invention, there is provided a semiconductor device that includes a chip mounting portion that includes a first upper surface and a first lower surface located on the opposite side of the first upper surface, a semiconductor chip that includes a second upper surface with an electrode being formed and a second lower surface located on the opposite side of the second upper surface, a lead that extends in a first direction and one end of which is located in the vicinity of the semiconductor chip, and a wire that connects the electrode of the semiconductor chip and the lead. Further, the semiconductor device includes a sealing body that includes a third upper surface and a third lower surface located on the opposite side of the third upper surface and seals the semiconductor chip, the wire, a part of the lead, and a part of the chip mounting portion. Then, the first lower surface of the chip mounting portion is exposed from the third lower surface of the sealing body, the chip mounting portion and the wire are comprised of copper, and a thickness of the semiconductor chip is larger than the sum of a thickness of the chip mounting portion and a thickness from the second upper surface of the semiconductor chip to the third upper surface of the sealing body.

According to one embodiment of the present invention, it is possible to improve the reliability of the semiconductor device.

BRIEF DESCRIPTION OF THE DRAWINGS

FIG. 3 is a sectional diagram taken along the A-A' line in FIG. 2.

FIG. 4 is a sectional diagram taken along the B-B' line in FIG. 2.

DETAILED DESCRIPTION

Figure 1:
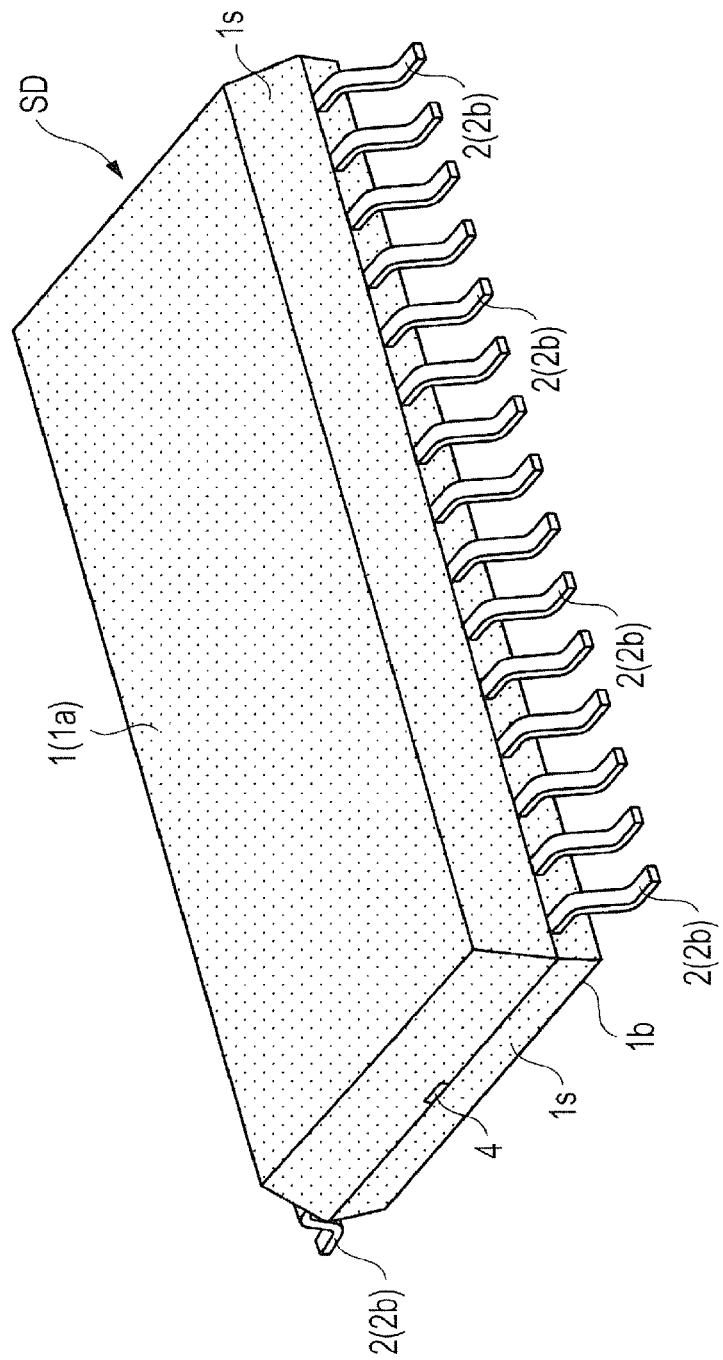
FIG. 1 is a perspective view illustrating one example of a semiconductor device according to a first embodiment of the present invention.

Although, in the following embodiments, description will be made by dividing into a plurality of sections or embodiments when division is requested for the convenience sake, these are not unrelated to each another and these are related to each other such that one covers some or all of altered examples, detailed explanation, supplemental explanation and so forth of the other unless otherwise clearly stated in particular.

In addition, in the following embodiments, in a case where a number of constitutional elements and so forth (a number of units, a numerical value, an amount/a quantity, a range and so forth are included) is referred to, it is not limited to the specific number and may be at least and/or not more than the specific number unless otherwise clearly stated in particular and unless otherwise definitely limited to the specific number in principle.

Further, in the following embodiments, it goes without saying that the constitutional elements (element steps and so forth are also included) thereof are not necessarily essential unless otherwise clearly stated in particular and unless otherwise thought to be clearly essential in principle.

Likewise, in the following embodiments, when the shapes of the constitutional elements and so forth, a positional relationship among them and so forth are referred to, the ones that are substantially approximate or similar to the shapes and so forth shall be included unless otherwise clearly stated in particular and unless otherwise clearly thought that they are not approximate or similar thereto in principle. The same is true of the above-mentioned numerical value and the range.

In addition, in all of the drawings illustrated in order to describe the embodiments, the same numerals are assigned to the same members in principle and repetitive description thereof is omitted. Incidentally, there are cases where hatching is added even in a plan view for easy illustration of the drawings.

First Embodiment

First, subjects that the inventors and others of the present application have clarified in regard to an SOP (Small Outline Package) type semiconductor device (a semiconductor package) that the inventors and others of the present application have examined will be described.

The above-mentioned semiconductor device is used as, for example, an electronic component for vehicle. In the field of vehicles, hybrid vehicles, plug-in hybrid vehicles and electric vehicles rapidly spread and needs for downsizing and improvement of fuel efficiency and engine performance are more and more increased. Then, in order to cope with these needs, power densities of a PCU (Power Control Unit), a motor driving battery and so forth have been greatly improved. There is a tendency that the electronic component for vehicle is used in a usage environment that is severer (high temperature) than ever with improvement of the power densities of the PCU, the motor driving battery and so forth. Accordingly, in the semiconductor package that is the electronic component for vehicle, a structure that a die pad is exposed from a back surface of a sealing body becomes the mainstream in order to improve heat radiation property.

In addition, the semiconductor device for vehicle is requested to undergo a temperature cycle test to be performed under a condition (a temperature range from about −65° C. to about 150° C.) that is more severe than ever in order to guarantee the operation in the severe usage environment. Here, the temperature cycle test is a reliability evaluation test to be performed in a development stage of the semiconductor device.

Figure 16:
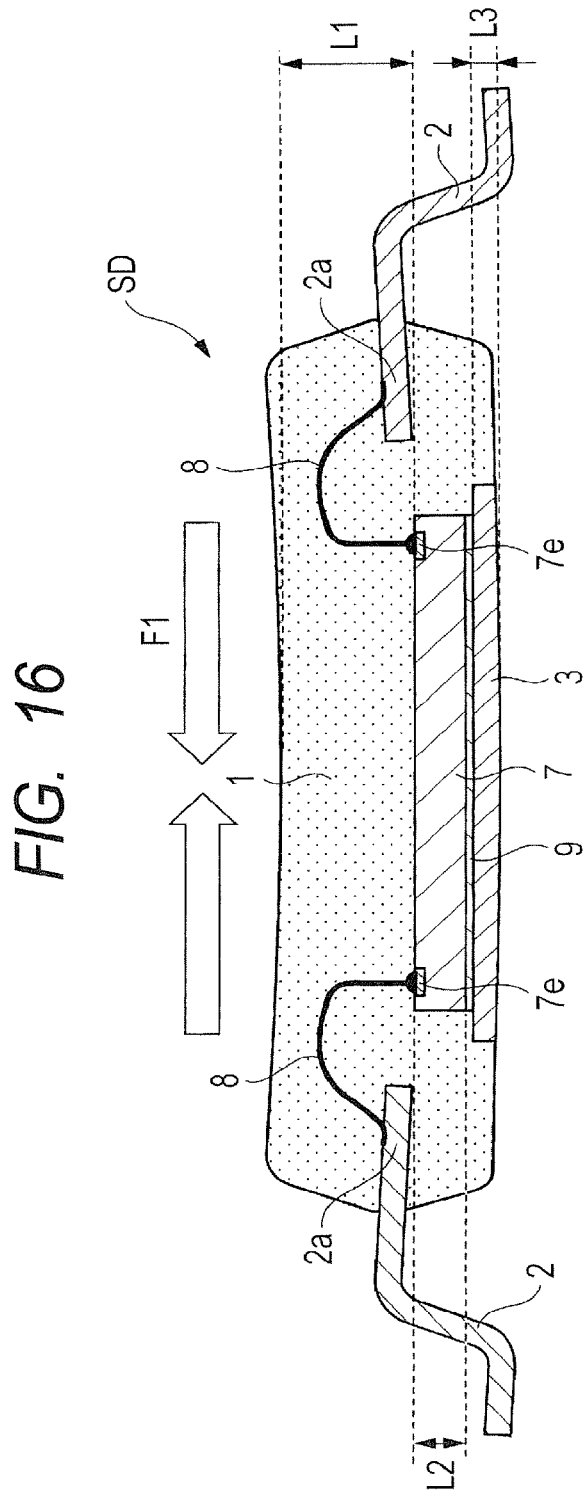
FIG. 16 is a sectional diagram illustrating one example of a semiconductor device that the inventors and others have examined.

FIG. 16 is a sectional diagram illustrating one example of the semiconductor device that the inventors and others of the present application have examined. Incidentally, FIG. 16 illustrates one example of a state where warping has occurred in the semiconductor device. As illustrated in FIG. 16, the semiconductor device includes a semiconductor chip 7, a plurality of die bonding pads 7e that have been formed on a principal surface of the semiconductor chip 7, a plurality of leads 2 that have been connected to the die bonding pads 7e via coupling wires 8, a die pad 3 on which the semiconductor chip 7 is to be mounted via a die bonding material 9, and a sealing body 1 that seals the semiconductor chip 7. Then, the die pad 3 is exposed from the sealing body 1 for radiation of heat that the semiconductor chip 7 generates to the outside. The sealing body 1 is a cured sealing resin.

According to the examination that the inventors and others of the present application have made, since the above-mentioned semiconductor device is subjected to high-temperature and low-temperature thermal stress while the semiconductor device is being manufactured (for example, in a resin sealing process or the temperature cycle test) or after the semiconductor device has been mounted, warping that a central part of the semiconductor device projects downward or upward occurs in the semiconductor device. Then, stresses that cause peeling along respective interfaces between the semiconductor chip 7 and the die pad 3, the die pad 3 and the sealing resin, the principal surface of the semiconductor chip 7 and the sealing resin and so forth work, and thereby interfacial peeling occurs and it leads to generation of cracks in the semiconductor chip 7 or the sealing body 1. In addition, after the semiconductor device has been mounted, warping becomes a main cause for worsening the reliability in coupling of the semiconductor device with a mount substrate. Incidentally, although in FIG. 16, a case where the central part of the semiconductor device warps downward is illustrated, a direction that the semiconductor device warps is determined depending on a volume ratio of the die pad 3 to the sealing body 1 and a composition of the resin material.

Since, in the above-mentioned semiconductor device, the die pad 3 is exposed from the back surface of the sealing body 2, the semiconductor device has a structure that the semiconductor chip 7 is located under the sealing body 1 (in other words, on the side that is lower than a coupling surface of an inner lead 2a to be connected with the coupling wire 8) and the comparatively thick sealing resin is present on the principal surface of the semiconductor chip 7. Then, a thickness of the semiconductor chip 7 is less than ⅓ of a thickness of the semiconductor device. Further, a thickness of the die pad 3 that is located under the semiconductor chip 7 is very thin in comparison with the thickness of the semiconductor chip 7 or the thickness of the sealing resin on the principal surface of the semiconductor chip 7. Incidentally, thicknesses of the respective components of the semiconductor device are as follows. The thickness of the semiconductor device (in other words, the semiconductor package) is about 1 mm, a thickness L1 of the sealing body 1 (the sealing resin) on the semiconductor chip 7 is about 0.575 mm, a thickness L2 of the semiconductor chip 7 is about 0.28 mm, a thickness L3 of the die pad 3 (and the lead 2) is about 0.125 mm, and a thickness of the die bonding material 9 is about 0.02 mm, and the following relational expression (Formula 1) is established.

$$L1+L3 > L2 \quad \text{(Formula 1)}$$

In addition, the sealing resin that configures the sealing body 1 is an epoxy resin that contains additives such as silica and so forth, and a thermal expansion coefficient of the sealing resin is about 8 ppm/K, a thermal expansion coefficient of the die pad 3 that is configured by a copper (Cu) plate is about 17 ppm/K, and a thermal expansion coefficient of the semiconductor chip 7 that is comprised of silicon (Si) is about 3.5 ppm/K.

That is, for example, in a thickness (a height) direction of the semiconductor device, the semiconductor device has the structure that the semiconductor chip 7 that is comparatively small in thermal expansion coefficient and film thickness is arranged above the die pad 3 that is comparatively large in thermal expansion coefficient, the sealing resin that is comparatively large in thermal expansion coefficient and film thickness is arranged above the semiconductor chip 7, and the sum of the thickness L1 of the sealing resin (a part of the sealing body 1) located on the semiconductor chip 7 and the thickness L3 of the die pad 3 is thicker than the thickness L2 of the semiconductor chip 7. Therefore, when the semiconductor device expands or contracts by being subjected to the high-temperature and low-temperature stress, the stress that works to project the central part of the semiconductor device upward or downward is generated (when the central part projects downward, for example, a stress F1 illustrated in FIG. 16 is generated) and therefore warping occurs in the semiconductor device. In other words, since a ratio of the thickness of the semiconductor chip 7 to the thickness of the semiconductor device is small (for example, less than ⅓) and the semiconductor chip 7 is located on the lower side of the semiconductor device, warping occurs.

Next, a structure of a semiconductor device according to the first embodiment configured so as to settle the above-mentioned subjects will be described.

<Structure of Semiconductor Device>

Figure 2:
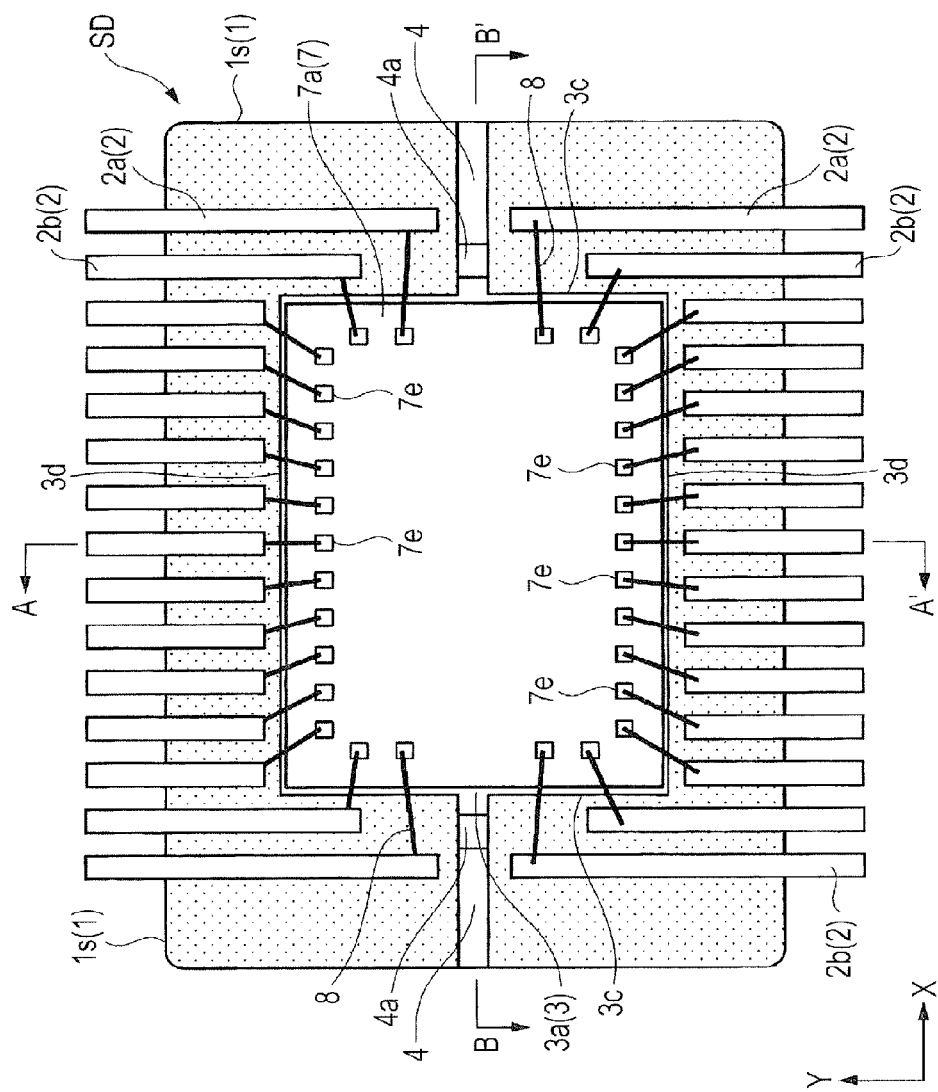
FIG. 2 is a plan view illustrating one example of the semiconductor device according to the first embodiment.

FIG. 1 is a perspective view illustrating one example of a semiconductor device according to the first embodiment. FIG. 2 is a plan view illustrating one example of the semiconductor device according to the first embodiment. FIG. 3 is a sectional diagram taken along the A-A' line in FIG. 2. FIG. 4 is a sectional diagram taken along the B-B' line in FIG. 2. As illustrated in FIG. 1, a semiconductor device SD according to the first embodiment includes the sealing body 1, the plurality of leads 2 and so forth. The sealing body 1 is a rectangular parallelepiped (almost rectangular parallelepiped) and includes facing principal surface (an upper surface) 1a and a back surface (a lower surface) 1b, and four side surfaces is that join together the principal surface 1a and the back surface 1b. The principal surface 1a and the back surface 1b each has a rectangular oblong shape having the long sides and the short sides and the plurality of leads 2 project respectively from the two long-side side surfaces is in a direction orthogonal to the long sides. An outer lead (an outer part) 2b that is a part of each lead 2 that has been exposed from the sealing body 1 is shaped into a gullwing form and is configured by a first part that extends in a direction away from the sealing body 1, a second part that extends from the first part toward the back surface 1b side of the sealing body 1, and a third part that is connected to the second part and extends in a direction away from the sealing body 1. Then, the first part and the third part are almost parallel with the principal surface 1a or the back surface 1b of the sealing body 1. In addition, the third part is located almost even with the back surface 1b. In addition, each suspension lead 4 terminates at each short-side side surface 1s. The leads 2 are arranged on only the two long-side side surfaces is and are not arranged on the two short-side side surfaces 1s.

As illustrated in FIG. 2, the semiconductor device SD includes the semiconductor chip 7, the die pad (a chip mounting portion, a tub) 3, the suspension leads 4, the plurality of leads 2, the sealing body 1 and so forth.

The semiconductor chip 7 is arranged on a central part of the semiconductor device SD. The semiconductor chip 7 is comprised of silicon (Si) and, though not illustrated, a plurality of semiconductor elements are formed on a rectangular oblong principal surface 7a of the semiconductor chip 7. In addition, a plurality of bonding pads (electrodes, outer extraction electrodes) 7e that have been electrically connected with the semiconductor elements are formed on the principal surface 7a. Each of the bonding pads 7e is configured by a conductor film that contains aluminum (Al) or copper (Cu) as a main conductor and is connected to each lead 2 via each coupling wire 8.

The semiconductor chip 7 is mounted on (bonded onto) a principal surface 3a of the rectangular oblong die pad (the tub) 3. The rectangular oblong die pad 3 has two facing long sides 3d and two facing short sides 3c, and the suspension leads 4 are connected to central parts of the two short sides 3c. The suspension leads 4 extend in an X direction that is a long-side direction of the sealing body 1, one end of each suspension lead 4 is connected to the die pad 3 and the other end of each suspension lead 4 reaches each short-side side surface is of the sealing body 1. In addition, an offset part 4a is provided on the one-end side of each suspension lead 4.

The plurality of leads 2 extend in a Y direction that is orthogonal to the long sides of the sealing body 1, are sealed with the sealing body 1 and are configured by the inner leads 2a that are located in the sealing body 1 and the outer leads 2b that are exposed from the sealing body 1 and are located outside the sealing body 1. One end of each lead 2 is located in the sealing body and around the semiconductor chip 7 and the other end of each lead 2 terminates at the outside of the sealing body 1. Each coupling wire 8 is connected to one end of each lead 2 and each coupling wire 8 connects each lead 2 and each bonding pad 7e. The leads 2, the die pad 3 and the suspension leads 4 each is configured by a copper (Cu) plate (a copper foil) of a film thickness of about 0.125 mm (125 μm). Each coupling wire 8 is a copper wire having a diameter of about 30 μm to about 35 μm.

The sealing body 1 is comprised of the epoxy resin that contains additives such as silica and so forth and seals the semiconductor chip 7, the coupling wires 8, the die pad 3, the suspension leads 4, and the plurality of inner leads 2a.

As illustrated in FIG. 3, the semiconductor chip 7 is mounted on (bonded onto) the principal surface 3a of the die pad 3 via the die bonding material 9. The die bonding material 9 is a conductive paste of a composition that a conductive filler such as silver dust, copper dust or the like is contained in an organic binder. In case of a structure that the back surface 3b of the die pad 3 has been exposed from the back surface 1b of the sealing body 1, it is favorable to use the conductive paste for improvement of the heat radiation property. However, an insulating paste may be also used.

The bonding pads 7e that have been formed on the principal face 7a of the semiconductor chip 7 are connected to the respective leads 2 via the coupling wires 8. In a wire bonding process, first, after one end of each coupling wire 8 has been connected to each bonding pad 7e, the other end side of each coupling wire 8 is connected to each inner lead 2a and thereafter the coupling wire 8 is cut off, leaving its coupling section as it is. That is, the bonding pad 7e side is a first bonding point and the inner lead 2a side is a second bonding point. The semiconductor device SD has features as follows owing to the above-mentioned order that wire bonding is performed.

Each coupling wire 8 that has been connected to each bonding pad 7e draws a wire loop that goes up from the first bonding point away from the principal surface 7a of the semiconductor chip 7, reaches a highest point, and thereafter goes down to each inner lead 2a and is connected to each inner lead 2a. The highest point of this wire loop is called, for example, a wire top. The wire top is located right above the semiconductor chip 1, in other words, right above each bonding pad 7e.

In addition, at the first bonding point, a ball part 8a is formed on one end of each coupling wire 8 and this ball part 8a is connected to each bonding pad 7e. Since a diameter of each ball part 8a is larger than a diameter of each coupling wire 8, a width of each ball part 8a is larger (wider) than a width (the diameter) of each coupling wire 8 as illustrated in FIG. 3. On the other hand, at the second bonding point, since each coupling wire 8 is pressed against and connected with each inner lead 2a, no ball part 8a is present.

In addition, at the first bonding point, an angle θ1 that an extending direction of each coupling wire 8 forms relative to the principal surface 7a of the semiconductor chip 7 is almost a right angle and is held within a range of about 80 degrees≤θ1≤about 110 degrees. In addition, at the second bonding point, an angle θ2 that the extending direction of each coupling wire 8 forms relative to each inner lead 2a is generally held within a range of 0 degrees<θ2≤about 60 degrees and a relation θ1>θ2 is established.

In addition, as illustrated in FIG. 3, in the first embodiment, a thickness L2a of the semiconductor chip 7 is made larger (L2a>L2) than the thickness L2 in the aforementioned examination example and a thickness L1a of the sealing resin on the principal surface 7a of the semiconductor chip 7 is made smaller (L1a<L1) than the thickness L1 in the aforementioned examination example. A thickness of the semiconductor device SD and a thickness L3a of the die pad 3 are equal to the thickness L3 in the examination example (L3a=L3). Incidentally, the thicknesses L1a, L2a and L3a are set such that L1a=about 0.355 mm, L2a=about 0.5 mm, and L3a=about 0.125 mm. Accordingly, in the first embodiment, the following relational expression (Formula 2) is established.

$$L1a+L3a \leq L2a \quad \text{(Formula 2)}$$

The semiconductor device according to the first embodiment has been structured such that the sum of the thickness L1a of the sealing resin (the part of the sealing body 1) that is provided on the principal surface 7a of the semiconductor chip 7 and is comparatively large in thermal expansion coefficient and the thickness L3a of the die pad 3 that is large in thermal expansion coefficient becomes not more than the thickness L2a of the semiconductor chip 7 in the thickness (height) direction of the semiconductor device SD, by making the thickness L2a of the semiconductor chip 7 thick (large) and by making the thickness L1a of the sealing resin on the principal surface 7a of the semiconductor chip 7 thin (small) in this way. In other words, warping of the semiconductor device SD is prevented by making the ratio of the thickness of the semiconductor chip 7 to the thickness of the semiconductor device SD large (for example, at least ⅓). In this case, since each lead 2 is arranged on the center in the thickness (height) direction of the semiconductor device SD, the principal surface 7a of the semiconductor chip 7 is located higher than a surface of each inner lead 2a onto which each coupling wire 8 has been connected.

In addition, it is preferable to make the thickness L1a of the sealing resin on the principal surface 7a of the semiconductor chip 7 thin to such an extent that the coupling wires 8 are wholly hidden away. That is, the coupling wires 8 are not exposed from the principal surface 7a. When the coupling wires 8 are exposed from the principal surface 1a of the sealing body 1, it is feared that the reliability of the semiconductor device SD may be reduced due to breaking and so forth of the coupling wire(s) 8. In addition, it is also feared that the reliability of the semiconductor device SD may be reduced due to intrusion of water into the device through the interface between each coupling wire 8 and the sealing resin.

In addition, as illustrated in FIG. 2 and FIG. 3, each coupling wire 8 that has been connected to each bonding pad 7e and is configured by a copper wire passes over the principal surface 7a of the semiconductor chip 7 and is connected to each inner lead 2a that is located outside the semiconductor chip 7 in planer view. That is, the semiconductor device SD has the structure that the plurality of coupling wires 8 that are configured by the copper materials cover the principal surface 7a of the semiconductor chip 7 and extend down to the inner leads 2a, the plurality of coupling wires 8b that are configured by the copper materials are arranged on the principal surface 7a side of the semiconductor chip 7, and the die pad 3 that is configured by the copper material is arranged on the back surface 7b side of the semiconductor chip 7. Owing to arrangement of the copper materials on the principal surface 7a and the back surface 7b of the semiconductor chip 7 in this way, expansion rates on the principal surface 7a side and the back surface 7b side become approximate to each other, balance in stress is achieved and thereby it is possible to prevent the semiconductor device SD from warping.

As illustrated in FIG. 4, a back surface 3b of the die pad 3 is exposed from the back surface 1b of the sealing body 1. Then, the suspension leads 4 are connected to the die pad 3, and the suspension leads 4 extend up to the side surfaces 1s of the sealing body 1 and terminate at the side surfaces 1s. The suspension leads 4 each includes the offset part 4a that is inclined at an angle θ3 relative to the back surface 1b of the sealing body 1. Favorably, the angle of inclination θ3 of each offset part 4a is held within a range of about 30 degrees≤θ3≤about 45 degrees. This is because when the angle of inclination θ3 is shallow, the offset part 4a concerned does not undergo plastic deformation and the height of the die pad 3 is not stabilized. When the height of the die pad 3 becomes unstable, an adverse effect that the sealing resin goes round and intrudes into the back surface 3b of the die pad 3 in a later described resin sealing process and exposure of the die pad 3 becomes insufficient may occur. Incidentally, in FIG. 4, a broken-line part is a boundary between the die pad 3 and each suspension lead 4. Accordingly, a part of each suspension lead 4 that is located between each offset part 4a and the die pad 3 is exposed from the sealing body 1.

<Manufacturing Method for Semiconductor Device>

Figure 6:
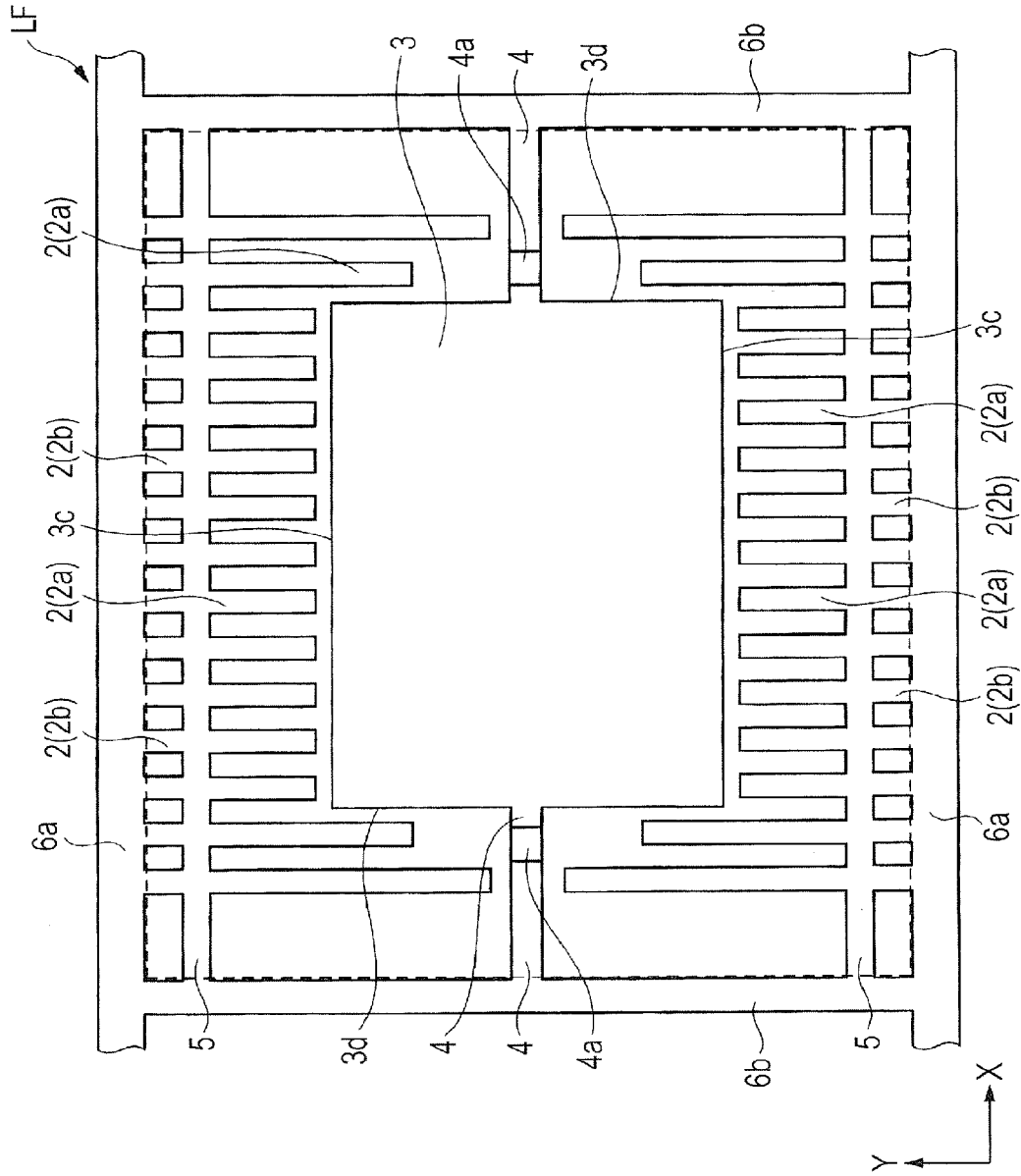
FIG. 6 is a plan view illustrating one example of a lead frame of the semiconductor device according to the first embodiment that is being subjected to the manufacturing process.
Figure 7:
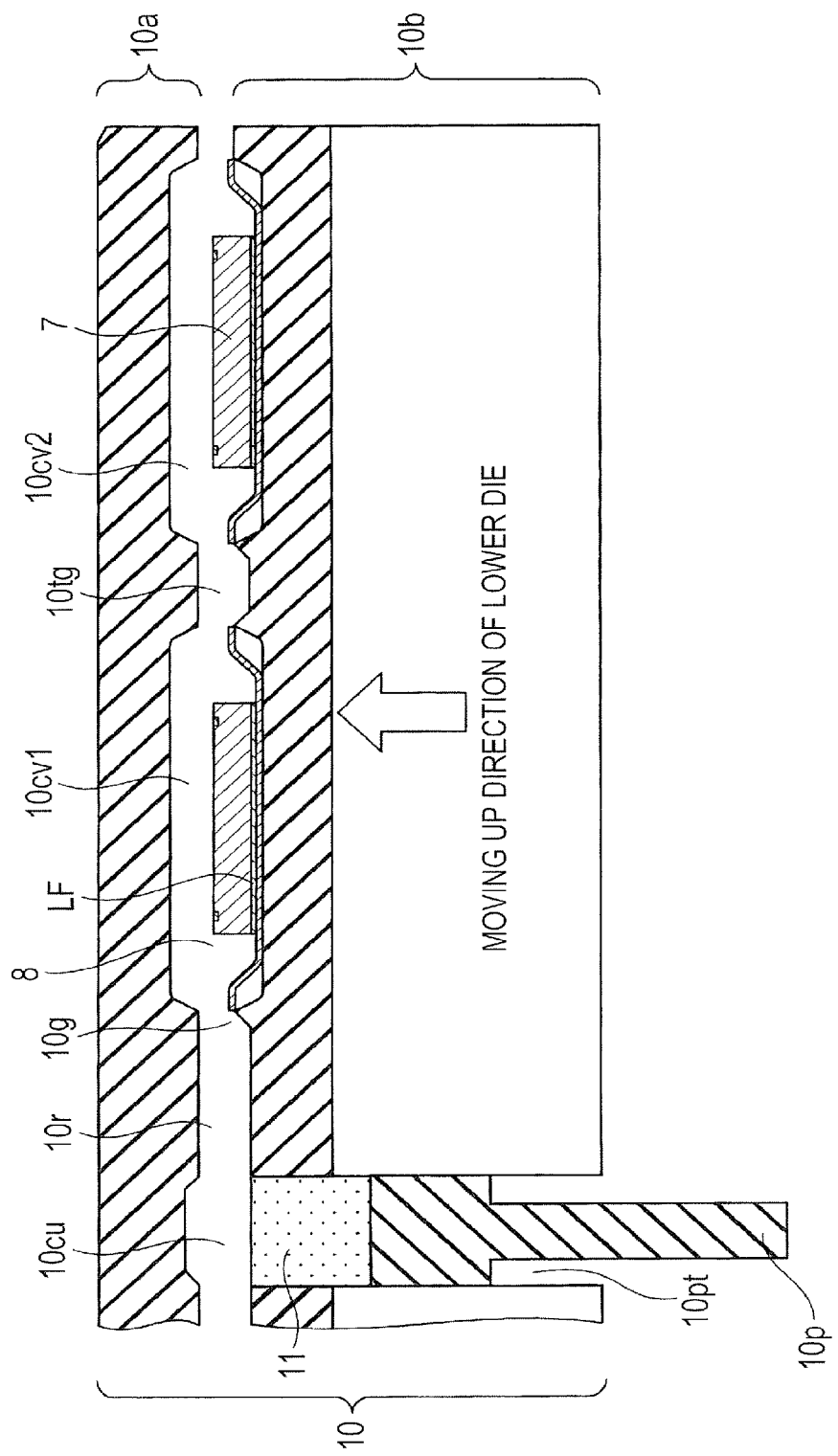
FIG. 7 is a sectional diagram illustrating one example of the semiconductor device according to the first embodiment that is being subjected to the manufacturing process.
Figure 8:
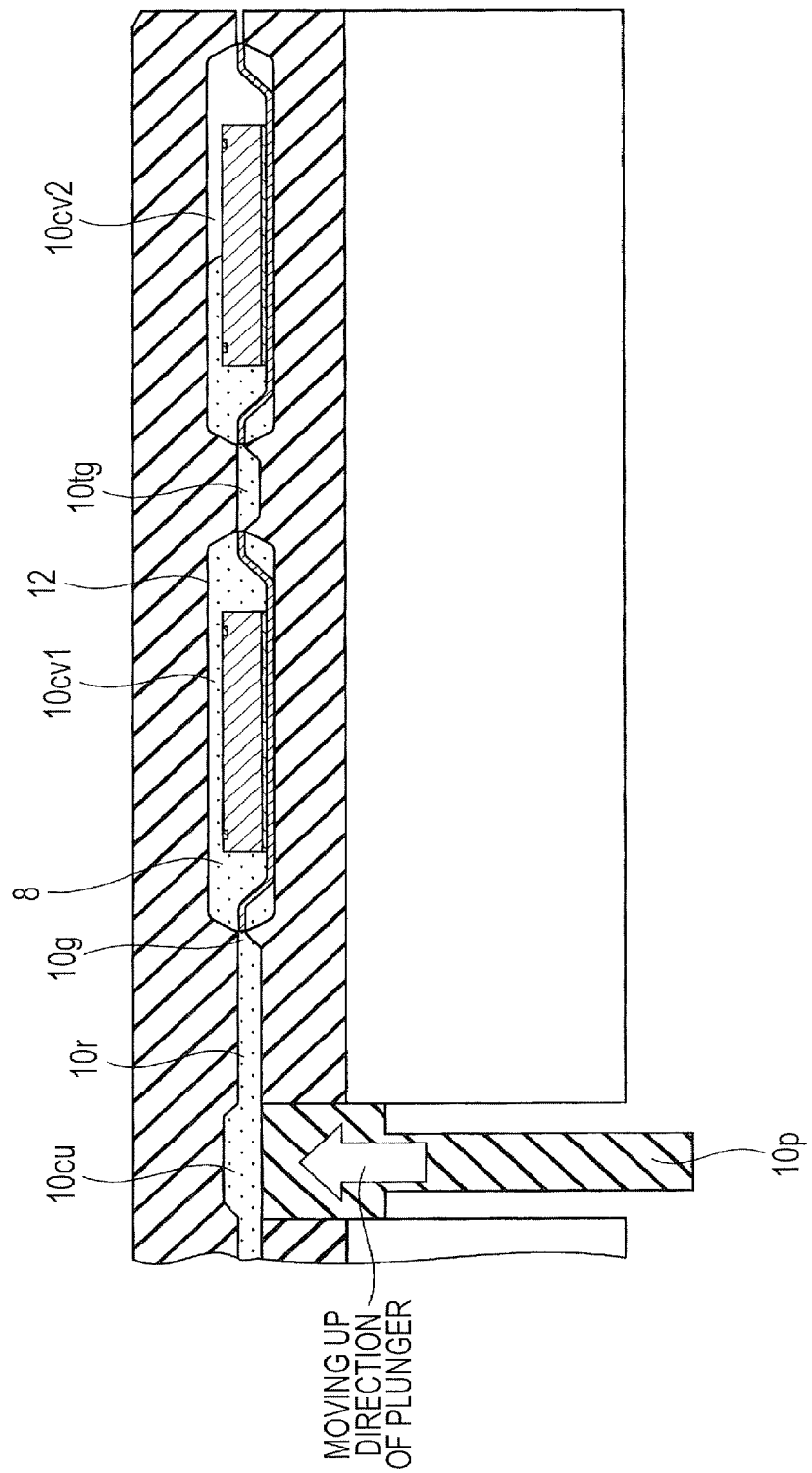
FIG. 8 is a sectional diagram illustrating one example of the semiconductor device that is being subjected to the manufacturing process, following the process in FIG. 7.

FIG. 5A to FIG. 5E each is a sectional diagram illustrating one example of the semiconductor device SD according to the first embodiment that is being subjected to a manufacturing process. That is, FIG. 5A to FIG. 5E each illustrates the sectional diagram of the section of the semiconductor device SD illustrated in FIG. 3 that is being subjected to the manufacturing process. FIG. 6 is a plan view illustrating one example of a lead frame of the semiconductor device SD according to the first embodiment that is being subjected to the manufacturing process. FIG. 7 is a sectional diagram illustrating one example of the semiconductor device SD according to the first embodiment that is being subjected to the manufacturing process. FIG. 8 is a sectional diagram illustrating one example of the semiconductor device SD according to the first embodiment that is being subjected to the manufacturing process, following the process in FIG. 7.

Figure 5A:
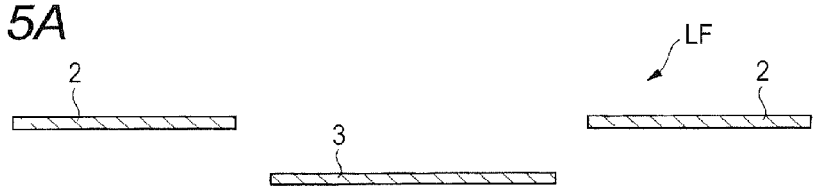
FIG. 5A is a sectional diagram illustrating one example of the semiconductor device according to the first embodiment that is being subjected to a manufacturing process

First, FIG. 5A illustrates one example of a process of preparing a lead frame LF. As illustrated in FIG. 5A and FIG. 6, the lead frame LF that is comprised of copper (Cu) includes one pair of outer frames 6a that extend in an X direction and one pair of outer frames 6b that extend in a Y direction, the plurality of leads 2 that extend in the Y direction are connected to the outer frames 6a and the suspension leads 4 that are connected to the die pad 3 and extend in the X direction are connected to the outer frames 6b. In addition, the offset parts 4a are formed on the suspension leads 4 and the die pad 3 is located lower than the surface of each lead 2. The plurality of leads 2 that extend in the Y direction are linked together by bus bars 5 that extend in the X direction and are connected to the outer frames 6b. A part of each lead 4 that is located on the die pad 3 side configures each inner lead 2a and a part of each lead 4 that is located on the outer frame 6a side configures each outer lead 2b, with each bus bar 5 being set as a boundary.

In FIG. 6, a region that has been surrounded by the outer frames 6a and 6b and is indicated by a broken line is a formation region for the semiconductor device SD illustrated in FIG. 2. For example, the one pair of outer frames 6a extend in the X direction and the plurality of formation regions are arranged between the one pair of outer frames 6a. That is, the plurality of formation regions are provided in the lead frame LF.

Figure 5B:
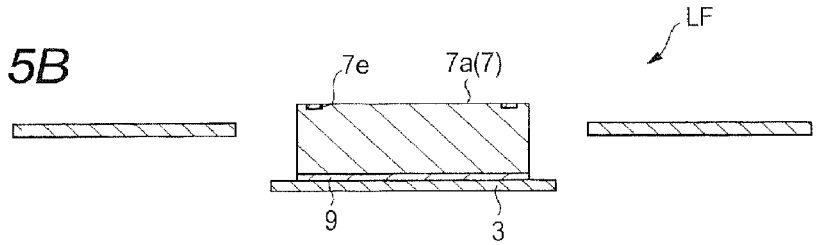
FIG. 5B is a sectional diagram illustrating one example of the semiconductor device according to the first embodiment that is being subjected to the manufacturing process.

Next, FIG. 5B illustrates one example of a die bonding process. The semiconductor chip 7 with the plurality of bonding pads 7e being formed on the principal surface 7a is connected onto the die pad 3 by using the die bonding material 9. As the die boding material 9, the conductive past of the composition that the conductive filler such as the silver dust, the copper dust or the like is contained in the organic binder that is comprised of the epoxy-system thermosetting resin is used. Incidentally, as the die boding material 9, a double-sided bonding agent that is called DAF (Die Attach Film) may be also used.

Figure 5C:
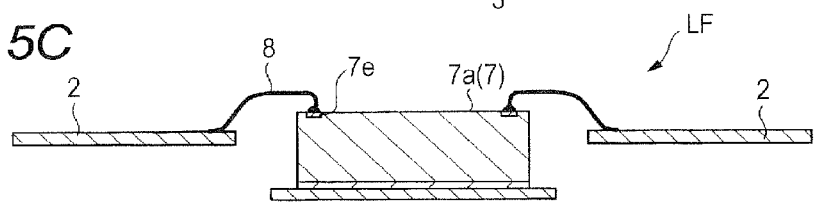
FIG. 5C is a sectional diagram illustrating one example of the semiconductor device according to the first embodiment that is being subjected to the manufacturing process.

Next, FIG. 5C illustrates one example of a wire bonding process. First, one end of each wire that is configured by a copper wire is connected to each die bonding pad 7e and then connected to each lead 2. Thereafter, each coupling wire 8 is formed by cutting off the copper wire, leaving its coupling section as it is. It is favorable to form in advance a silver-plated layer on a part of the copper wire coupling section on the lead 2 side. In addition, it is favorable to perform the wire bonding process by using ultrasonic bonding in combination with thermo-compression bonding.

Figure 5D:
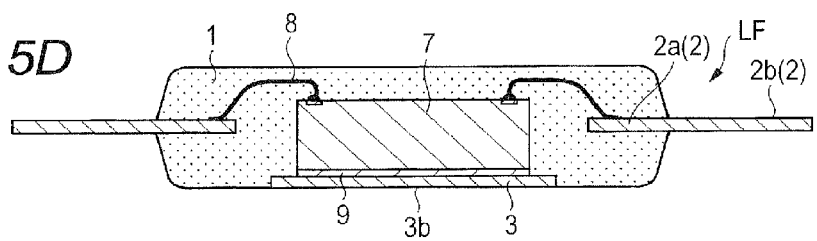
FIG. 5D is a sectional diagram illustrating one example of the semiconductor device according to the first embodiment that is being subjected to the manufacturing process.

Next, FIG. 5D illustrates examples of a resin sealing process and a plating process. The sealing body 1 is formed by sealing the semiconductor chip 7, the inner leads 2, the coupling wires 8, and the die pad 3 by using, for example, a sealing resin configured by a thermosetting epoxy resin that contains spherical silica particles and so forth. Needless to say, the back surface 3b of the die pad 3 is exposed from the sealing body 1.

In the resin sealing process, first, as illustrated in FIG. 7, each lead frame LF on which the wire bonding process has been already performed is placed between an upper die 10a and a lower die 10b of a mold 10. In this case, the semiconductor chip 7 and the coupling wires 8 are installed in each of cavities 10cv1 and 10cv2 that are configured by the upper die 10a and the lower die 10b. A gate part 10g that is an inlet through which the sealing resin is to be injected into the cavity 10cv1, a through-gate part 10tg that is a path of the sealing resin between the cavities 10cv1 and 10cv2, a runner 10r and a cull 10cu are formed in the mold 10. In addition, a tablet 11 to be used as the sealing resin is arranged on a plunger 10p of a pot part 10pt.

After the upper die 10a and the lower die 10b have been clamped together so as to nip the lead frames LF between them, the plunger 10p is moved upward and the tablet 11 is sent into the cull 10cu as illustrated in FIG. 8. In this case, since the mold 10 is heated to a high temperature of, for example, about 175° C., the tablet 11 is melted into a fluidized resin 12. Then, the fluidized resin 12 is sequentially injected from the cull 10cu into the cavities 10cv1 and 10cv2 with pushing force of the plunger 10p, passing through the runner 10r.

Then, each lead frame LF that has been subjected to the resin sealing process is taken out of the mold 10 and its temperature is returned to the room temperature. Then, when the thermosetting resin has been used as the sealing resin, a cure acceleration process is performed on each lead frame LF that has been subjected to the resin sealing process by putting each lead frame LF into a drying tank that has been heated to about 175° C. for about six to seven hours and thereafter each lead frame LF is taken out of the drying tank and its temperature is returned to the room temperature for the purpose of increasing the hardness of the resin 12 (called a "cure baking process"). That is, the processes that the semiconductor chip 7, the die pad 3, and the resin 12 (that is, the sealing body 1) that have been heated to the high temperature in the resin sealing process are cooled down to the room temperature, and are again heated to the high temperature in the cure baking process and are then again cooled down to the room temperature are the causes of warping. However, since in the first embodiment, the thickness of the semiconductor chip 7 has been made thick and the thickness of the sealing resin on the principal surface 7a of the semiconductor chip 7 has been made thin, it becomes possible to reduce warping and it becomes possible to prevent the semiconductor chip 7 and/or the sealing body 1 from being cracked.

After completion of performance of the resin sealing process, the bus bars 5 between the adjacent leads 2 and between each lead 2 and each outer frame 6b are cut off. Then, thereafter, a solder plating film (not illustrated) is formed on the surface of each outer lead 2b. The solder plating film is configured by a pure Sn material, a Sn—Bi based material or a Sn—Cu based material. The processes that have been described so far are performed in the state of the lead frame LF.

Figure 5E:
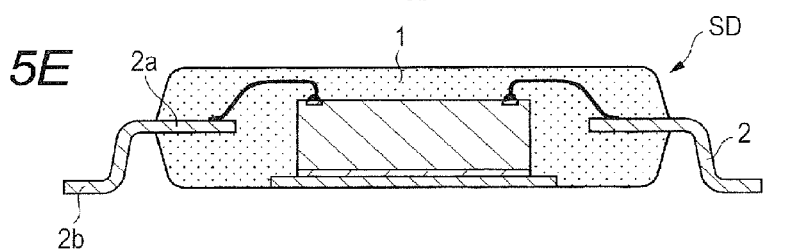
FIG. 5E is a sectional diagram illustrating one example of the semiconductor device according to the first embodiment that is being subjected to the manufacturing process.

FIG. 5E illustrates one example of a lead forming process. After completion of performance of the plating process, each outer lead 2b is separated from each outer frame 6a. Then, each outer lead 2b is formed into the gullwing shape. Thereafter, each suspension lead 4 is cut apart from each outer frame 6b. The semiconductor device SD is completed in this way. Incidentally, in some cases, the aforementioned temperature cycle test is performed on the completed semiconductor device SD for confirmation of the mounting reliability.

In a case where thermal stress of high and low temperatures such as those that have been supposed in the temperature cycle test have been imparted on the semiconductor device SD of the structure illustrated in FIG. 3, expansion and contraction of the semiconductor chip 7, the sealing body 1 and the die pad 3 repetitively occur and repetitive occurrence of expansion and contraction causes warping of the semiconductor device SD. However, in the first embodiment, since the thickness of the semiconductor chip 7 has been made thick and the thickness of the sealing resin on the principal surface 7a of the semiconductor chip 7 has been made thin, it is possible to reduce warping of the semiconductor device SD. Thereby, since it is possible to reduce the stresses that cause peeling along the respective interfaces between the semiconductor chip 7 and the die pad 3, the die pad 3 and the sealing resin, the principal surface 7a of the semiconductor chip 7 and the sealing resin and so forth, it is possible to prevent destruction (bulk destruction) of the die bonding material 9 between the semiconductor chip 7 and the die pad 3 and/or to prevent breakage of the coupling wires 8 caused by cracking of the sealing body 1.

<Main Features and Advantageous Effects>

The semiconductor device SD has been structured such that the sum of the thickness L1a of the sealing resin (the part of the sealing body 1) on the semiconductor chip 7 and the thickness L3a of the die pad 3 becomes not more than the thickness L2a of the semiconductor chip 7 in the thickness (the height) direction of the semiconductor device SD.

Thereby, even when the thermal stress of the high and low temperatures such as those that have been supposed in the resin sealing process or the temperature cycle test have been imparted on the semiconductor device SD, it is possible to reduce the stresses that cause peeling along the respective interfaces between the semiconductor chip 7 and the die pad 3, the die pad 3 and the sealing resin, the principal surface 7a of the semiconductor chip 7 and the sealing resin and so forth, and it is possible suppress cracking of the semiconductor chip 7 and/or the sealing body 1 caused by interfacial peeling. Here, "the high and low temperatures such as those that have been supposed in the temperature cycle test" are set by taking, for example, a mounting temperature of the semiconductor device SD or a temperature when operating the semiconductor device SD into consideration. That is, owing to the above-mentioned structure, it is possible to improve the reliability of the semiconductor device SD when mounting and/or when operating the semiconductor device SD.

In addition, since it is possible to reduce warping of the semiconductor device SD caused by thermal expansion and contraction of the semiconductor device SD that would occur in association with the operation of the semiconductor chip 7 and a change in ambient temperature after the semiconductor device SD has been mounted on the mount substrate, a stress that is imparted onto a mounting part (a soldered part) of the mount substrate is relaxed and it is possible to improve the reliability of the semiconductor device SD.

Second Embodiment

Figure 9:
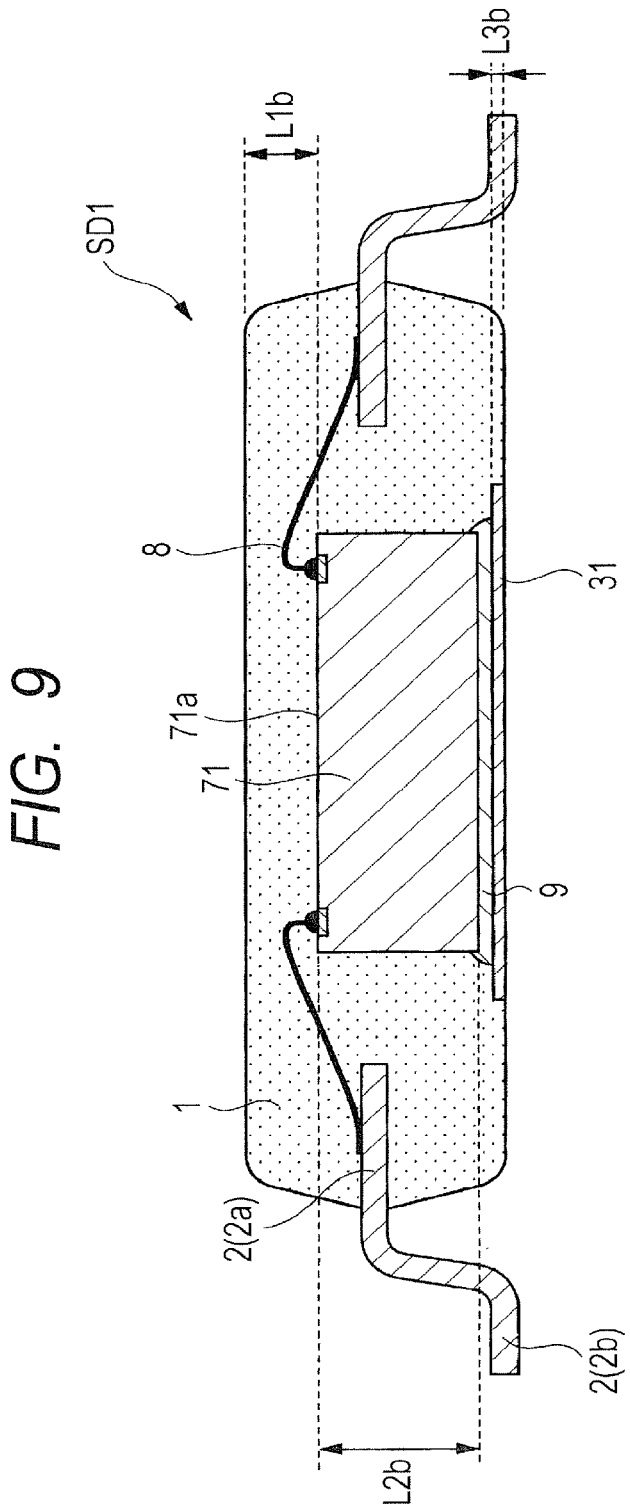
FIG. 9 is a sectional diagram illustrating one example of a semiconductor device according to a second embodiment.

FIG. 9 is a sectional diagram illustrating one example of a semiconductor device according to the second embodiment. The second embodiment is an altered example of the first embodiment. In the semiconductor device according to the second embodiment, a thickness of a die pad is made thin and a thickness of a semiconductor chip is made thick. Other parts are the same as those in the first embodiment and the same numerals are assigned to the parts.

In a semiconductor device SD1 according to the second embodiment, a thickness L3b of a die pad 31 is made thinner than the thickness L3a (L3b<L3a), a thickness L2b of a semiconductor chip 71 is made thicker than the thickness L2a (L2b>L2a), and a thickness L1b of a sealing resin on a principal surface 71a of the semiconductor chip 71 is made equal to the thickness L1a (L1b=L1a) in comparison with the semiconductor device SD according to the first embodiment. That is, the thickness of the semiconductor chip 71 is made thicker by the amount that the die pad 31 has been thinned. That is, also in the semiconductor device SD1 according to the second embodiment, the following relational expression (Formula 3) is established as in the case in the first embodiment.

$$L1b+L3b \leq L2b \qquad \text{(Formula 3)}$$

Since in the second embodiment, the thickness (L3b) of the die pad 31 has been made thinner than the thickness L3a and the thickness (L2b) of the semiconductor chip 71 has been made thicker than the thickness L2a in comparison with the first embodiment, it is possible to increase a ratio of the thickness of the semiconductor chip 71 to the thickness of the semiconductor device SD1 and an effect of preventing the semiconductor device SD1 from warping is increased.

Also in the second embodiment 2, the principal surface 71a of the semiconductor chip 71 is located higher than the surface of each inner lead 2a to which each coupling wire 8 has been connected. However, when the thickness of the die pad 31 has been made thinner than the thickness of the die bonding material 9, the principal surface 71a becomes flush with or lower than the surface of each inner lead 2a to which each coupling wire 8 has been connected.

Incidentally, in the second embodiment, the thickness of the die pad 31 is made thinner than the thickness of each inner leads 2a or each outer leads 2b, that is, a thin-type die pad is used. Since the die pad 31 is connected with a heat radiation pattern that is formed by a metal of a not illustrated mount substrate and heat that the semiconductor chip 71 generates is transferred via the heat radiation pattern, a distance from the semiconductor chip 71 to the mount substrate via the heat radiation pattern is reduced by using the thin-type die pad 31 and it is possible to improve the heat radiation property of the semiconductor chip 71.

Third Embodiment

Figure 10:
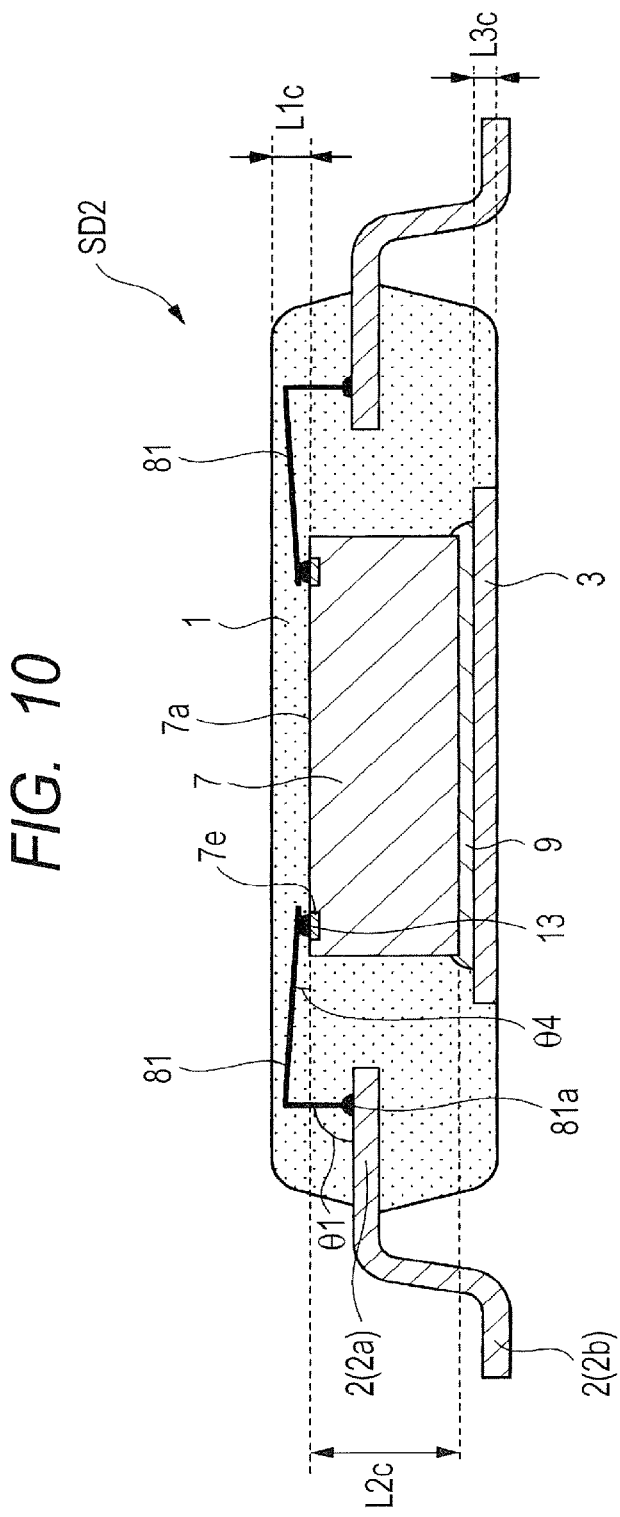
FIG. 10 is a sectional diagram illustrating one example of a semiconductor device according to a third embodiment.

FIG. 10 is a sectional diagram illustrating one example of a semiconductor device according to the third embodiment. The third embodiment is an altered example of the first embodiment and is different from the first embodiment in order that each coupling wire is connected. That is, the inner lead 2a side is the first ponding point and the bonding pad 7e side is the second bonding pad (for example, called "reverse bonding"). Other parts are the same as those in the first embodiment and the same numerals as those in the first embodiment are assigned to the parts.

In a semiconductor device SD2 according to the third embodiment, a thickness L1c of the sealing resin on the principal surface 7a of the semiconductor chip 7 is made thinner than the thickness L1a (L1c<L1a) in comparison with the semiconductor device SD according to the first embodiment. A thickness L2c of the semiconductor chip 7 and a thickness L3c of the die pad 3 are respectively equal to the thickness L2a (L2c=L2a) and the thickness L3a (L3c=L3a). That is, although the thickness of the semiconductor device SD2 is reduced by the amount that the thickness (L1c) of the sealing resin on the principal surface 7a of the semiconductor chip 7 has been reduced, the following relational expression (Formula 4) is established also in the semiconductor device SD2 according to the third embodiment.

$$L1c+L3c \leq L2c \quad \text{(Formula 4)}$$

Since in the third embodiment, the thickness (L1c) of the sealing resin on the principal surface 7a of the semiconductor chip 7 is made thinner and the thickness of the semiconductor device SD2 is also made thinner accordingly in comparison with those in the first embodiment, it becomes possible to increase the ratio of the thickness of the semiconductor chip 7 to the thickness of the semiconductor device SD2 and the effect of preventing the semiconductor device SD2 from warping is increased.

In addition, although each coupling wire 81 connects each inner lead 2a and each bonding pad 7e of the semiconductor chip 7, each inner lead 2a and each bonding pad 7e are connected by reverse bonding and therefore the aforementioned wire top is located right above each inner lead 2a. In addition, each ball part 81a that has been formed on one end of each coupling wire 81 is connected to each inner lead 2a and the other end of each coupling wire 81 is connected to each bonding pad 7e via each bump electrode 13. The bump electrode 13 is, for example, a metal conductor layer that is comprised of copper (Cu).

Since the inner lead 2a side is the first bonding point and the bonding pad 7e side is the second bonding point, an angle that an extending direction of each coupling wire 81 forms relative to the principal surface (the surface that each coupling wire 81 has been connected) of each inner lead 2a at the first bonding point is the aforementioned angle θ1 (that is, within the range of about 80 degrees≤θ1≤about 110 degrees). In addition, an angle θ4 that the extending direction of each coupling wire 81 forms relative to the principal surface 7a of the semiconductor chip 7 at the second bonding point is held within a range of about 0 degrees≤θ4≤about 30 degrees and a relation θ1>θ4 is established. In addition, since it is possible to reduce the thickness (L1c) of the sealing resin on the semiconductor chip 7 by reducing the angle θ4, it is favorable to reduce the angle θ4 within a possible range.

Incidentally, in the third embodiment, the semiconductor chip 7 is thickened by the amount that the die pad has been thinned by applying the thin-type die pad according to the second embodiment. In addition, it is possible to reduce the thickness of the sealing resin on the principal surface 7a of the semiconductor chip 7 and the effect of preventing the semiconductor device SD2 from warping is more increased.

Fourth Embodiment

Figure 11:
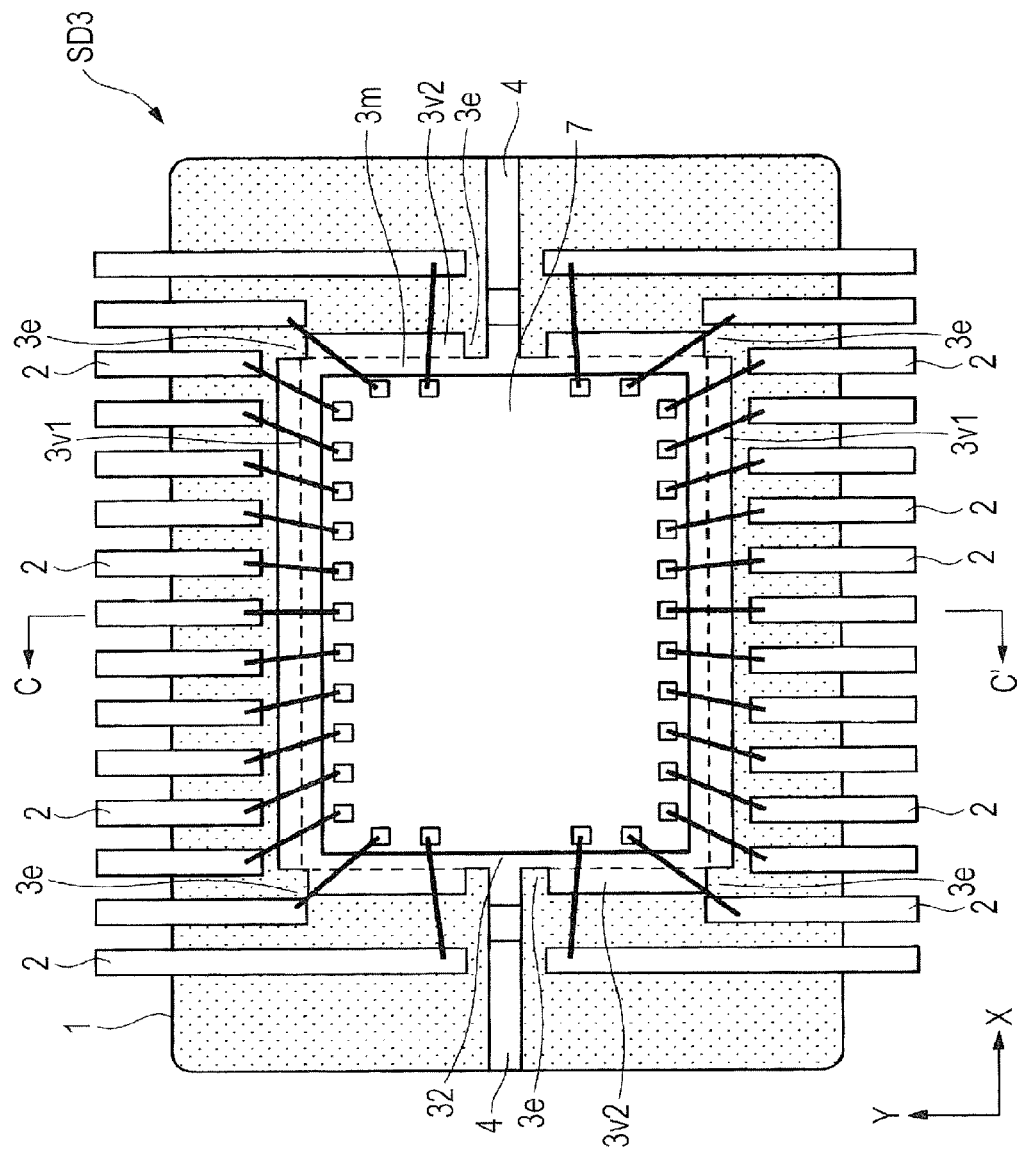
FIG. 11 is a plan view illustrating one example of a semiconductor device according to a fourth embodiment.
Figure 12:
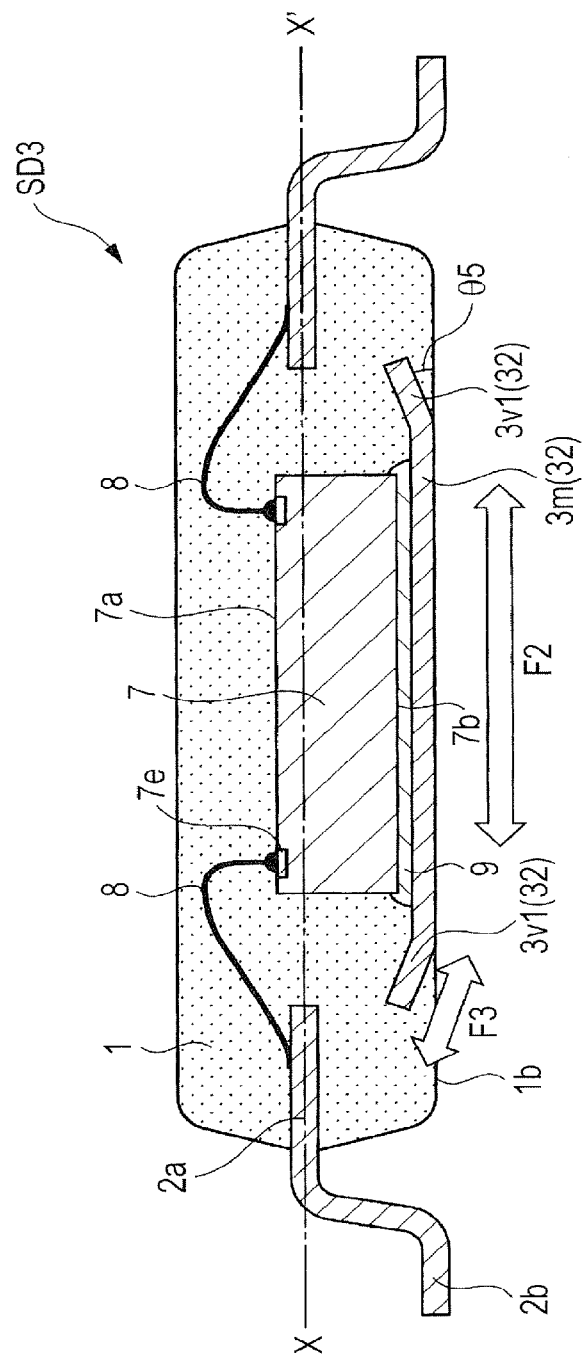
FIG. 12 is a sectional diagram taken along the C-C' line in FIG. 11.

FIG. 11 is a plan view illustrating one example of a semiconductor device according to the fourth embodiment. FIG. 12 is a sectional diagram taken along the C-C' line in FIG. 11. The fourth embodiment is an altered example of the first embodiment and is different from the first embodiment in the shape of the die pad. Other parts are the same as those in the first embodiment and the same numerals as those in the first embodiment are assigned to the parts.

As illustrated in FIG. 11, a semiconductor device SD3 according to the fourth embodiment includes a die pad 32 configured by a chip mounting region 3m and bent parts 3v1 and 3v2. In FIG. 11, a region that is surrounded with a broken line is the chip mounting region 3m. The chip mounting region 3m is a rectangular oblong region in planer view and has an external form that is larger than the semiconductor 7 to be mounted thereon in the X and Y directions.

The bent parts 3v1 and 3v2 are provided respectively along the long sides and the short sides of the chip mounting region 3m. Each bent part 3v1 that is provided along each long side of the chip mounting region 3m is formed over the entire length of each long side and the bent parts 3v2 that are provided along each short side are formed on both sides of each suspension lead 4. Although the bent parts 3v2 are provided over almost the entire length of each short side, it is favorable to separate the bent parts 3v2 from each suspension lead 4. Each bent part 3v1 that is provided along each long side of the chip mounting region 3m and each bent part 3v2 that is provided along each short side of the chip mounting region 3m are separated from each other at each corner of the chip mounting region 3m. In addition, the bent parts 3v2 that are provided along each shirt side of the chip mounting region 3m are separated from each suspension lead 4. Concave parts 3e are formed between each bent part 3v1 and each bent part 3v2 and between each bent part 3v2 and each suspension lead 4 and the concave parts 3e reach the chip mounting region 3m.

As illustrated in FIG. 12, the chip mounting region 3m of the die pad 32 is exposed from the back surface 1b of the sealing body 1 and each bent part 3v1 enters the sealing body 1. Though not illustrated in the drawing, also each bent part 3v2 enters the sealing body 1. A broken line in FIG. 11 is a boundary between the chip mounting region 3m and the bent parts 3v1 and 3v2. Each bent part 3v1 (also 3v2) is bent from the chip mounting region 3m on the broken-line part in FIG. 11 and has an inclination angle θ5 relative to the back surface 1b of the sealing body 1. It is favorable to hold the inclination angle θ5 within a range of about 30 degrees≤θ5≤about 60 degrees, taking the aforementioned plastic deformation into consideration. Since the bent parts 3v1 and 3v2 enter the sealing body 1, it is possible to prevent the die pad 32 from peeling off the sealing body 1 owing to an anchor effect.

It is possible to disperse the stress that is imparted when the die pad 32 expands and contracts to a stress F2 that works in a horizontal direction and a stress F3 that works in a direction that the bent parts 3v1 and 3v2 extend by configuring the die pad 32 using the chip mounting region 3m and the bent parts 3v1 and 3v2. Therefore, it is possible to relax the stress that is imparted onto the die bonding material 9 caused by a difference in thermal expansion coefficient between the semiconductor chip 7 and the die pad 32. Accordingly, it is possible to prevent a crack from spreading into the die bonding material 9. Further, it is possible to prevent the semiconductor chip 7 from peeling off the die pad 32. It is important to form the bent parts 3v1 and 3v2 both in the direction that the leads 2 extend and in the direction that the suspension leads 4 extend. Thereby, it is possible to relax the stresses caused by thermal expansion and contraction of the die pad 32 in the direction that the leads 2 extend and the direction that the suspension leads 4 extend.

In addition, since the bent parts 3v1 are separated from the bent parts 3v2, folding is performed on the bent parts 3v1 and 3v2 with ease and also folding accuracy is improved. In addition, since each bent part 3v2 is separated from each suspension lead 4, thermal expansion and contraction of each bent part 3v2 does not affect each suspension lead 4 and it is possible to avoid a variation in height of the die pad 32.

In addition, the plurality of coupling wires 8 that are configured by the copper materials are arranged on the principal surface 7a side of the semiconductor chip 7 and the die pad 32 that is configured by the copper material is arranged on the back surface 7b side of the semiconductor chip 7. In addition, the plurality of coupling wires 8 are inclined so as to go downward from above the semiconductor chip 7 toward the respective inner leads 2a. On the other hand, the bent parts 3v1 of the die pad 32 are inclined so as to go upward from the chip mounting region 3m toward the respective inner leads 2a. As illustrated in FIG. 12, the coupling wires 8 and the bent parts 3v1 extend in line-symmetrical directions relative to a virtual line X-X' that runs through the right and left inner leads 2a as illustrated in FIG. 12. Since the plurality of coupling wires 8 that are configured by the copper materials are arranged on the principal surface 7a side of the semiconductor chip 7, the die pad 32 that is configured by the copper material is arranged on the back surface 7b side of the semiconductor chip 7, and the direction that the coupling wires 8 extend is linearly symmetric with respect to the direction that the bent parts 3v1 extend in this way, it is possible to keep balance between the stresses imparted onto the principal surface 7a and the back surface 7b of the semiconductor chip 7 and it is possible to prevent the semiconductor device SD3 from warping.

In addition, the structure of the semiconductor device SD3 according to the fourth embodiment meets the aforementioned relational expression (Formula 2). Here, the thickness L3a of the die pad 32 corresponds to the thickness of the chip mounting region 3m.

In addition, in the fourth embodiment, the aforementioned second embodiment, third embodiment or both of the second and third embodiments may be applied.

First Altered Example

Figure 13:
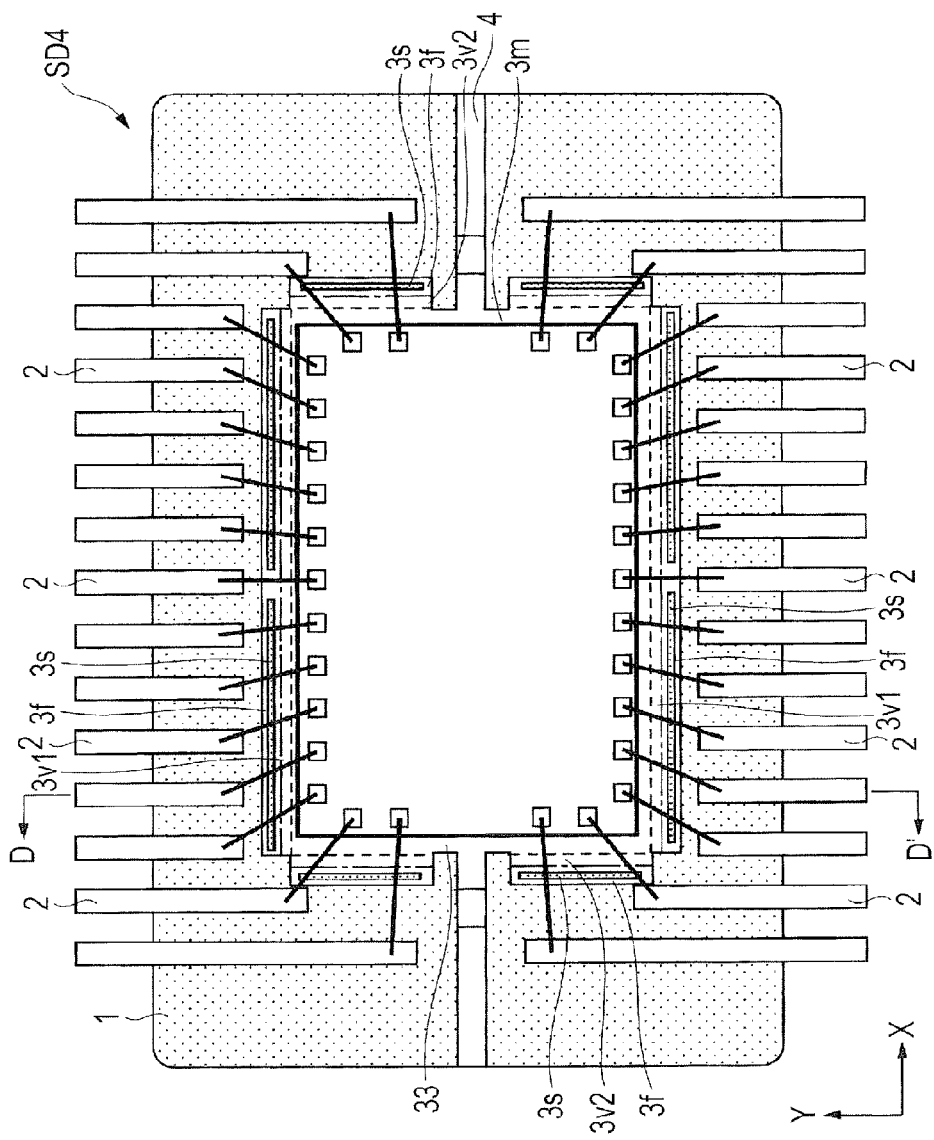
FIG. 13 is a plan view illustrating one example of a semiconductor device according to a first altered example.
Figure 14:
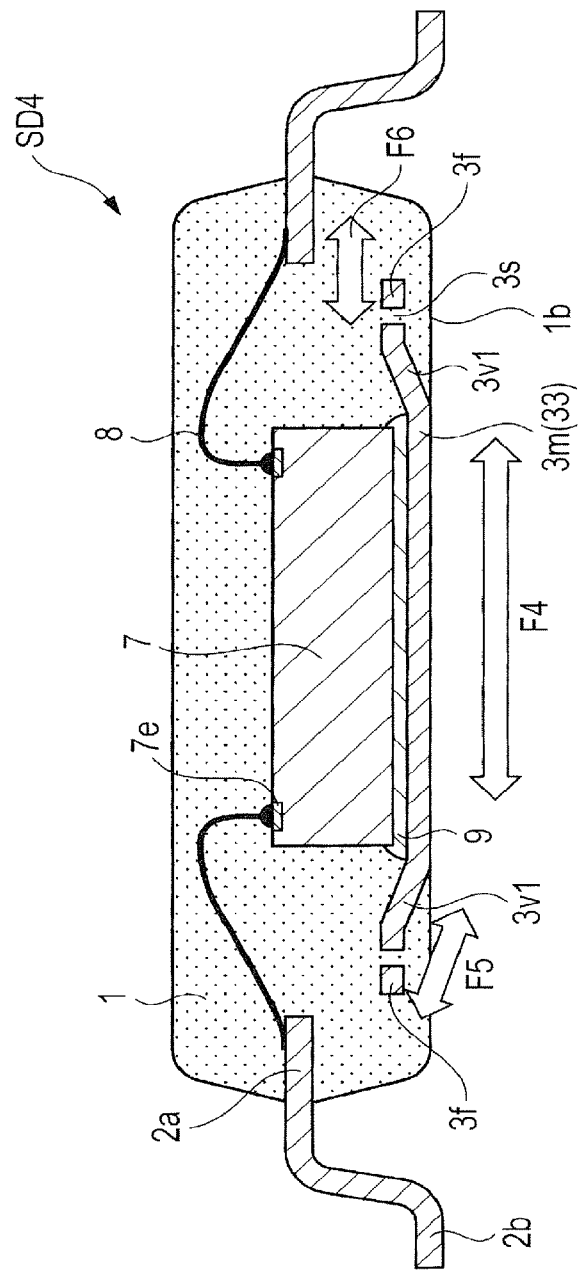
FIG. 14 is a sectional diagram taken along the D-D' line in FIG. 13.

FIG. 13 is a plan view illustrating one example of a semiconductor device according the first altered example. FIG. 14 is a sectional diagram taken along the D-D' line in FIG. 13. The first altered example is an altered example of the fourth embodiment and an altered example of the die pad. Other parts are the same as those in the first embodiment and the same numerals as those in the first embodiment are assigned to the parts.

As illustrated in FIG. 13, a semiconductor device SD4 according to the first altered example includes a die pad 33 configured by the chip mounting region 3m, the bent parts 3v1 and 3v2 and flat parts 3f and a slit 3s is formed in each flat part 3f. The chip mounting region 3m and the bent parts 3v1 and 3v2 according to the first altered example are the same as those in the fourth embodiment in structure, and in the first altered example, each flat part 3f with each slit 3s being formed therein is provided on the tip of each of the bent parts 3v1 and 3v2.

As illustrated in FIG. 14, the chip mounting region 3m of the die pad 33 is exposed from the back surface 1b of the sealing body 1 and the bent parts 3v1 and the flat parts 3f enter the sealing body 1. Though not illustrated in the drawing, also the bent parts 3v2 enter the sealing body 1. A broken line in FIG. 13 indicates a boundary between the chip mounting region 3m and the bent parts 3v1 and 3v2 and a one-point chain line in FIG. 13 indicates a boundary between the bent parts 3v1 and 3v2 and the flat parts 3f. The flat parts 3f extend from the bent parts 3v1 and 3v2 in directions away from the chip mounting region 3m in parallel with the back surface 1b of the sealing body 1. Then, the slits 3s that extend along the long sides or the short sides of the chip mounting region 3m (or the semiconductor chip 7) are formed in the flat parts 3f. The sealing resin is charged into the slits 3s.

It is possible to disperse the stress that is imparted when the die pad 33 expands and contracts to a stress F4 that works in the horizontal direction, a stress F5 that works in the direction that the bent parts 3v1 and 3v2 extend, and a stress F6 that works in the direction that the flat parts 3f extend by configuring the die pad 33 using the chip mounting region 3m, the bent parts 3v1 and 3v2 and the flat parts 3f. Therefore, it is possible to relax the stress that is imparted onto the die bonding material 9 caused by a difference in thermal expansion coefficient between the semiconductor chip 7 and the die pad 33.

In addition, since the slits 3s are formed in the respective flat parts 3f and the sealing resin is charged into the slits 3s, it is possible to suppress expansion and contraction of the die pad 33 owing to the anchor effect, and it is possible to more relax the stress imparted onto the die boding material 9.

It is important to provide each slit 3s in a region of each flat part 3f in a closed state. This is because when each slit 3s is formed string over the bent parts 3v1 and 3v2 and each flat part 3f, it becomes difficult to perform stable forming.

In addition, formation of the slits 3s is not indispensable and it is also possible to attain the effect of relaxing the stress with no formation of the slits 3s in the flat parts 3f.

Second Altered Example

Figure 15:
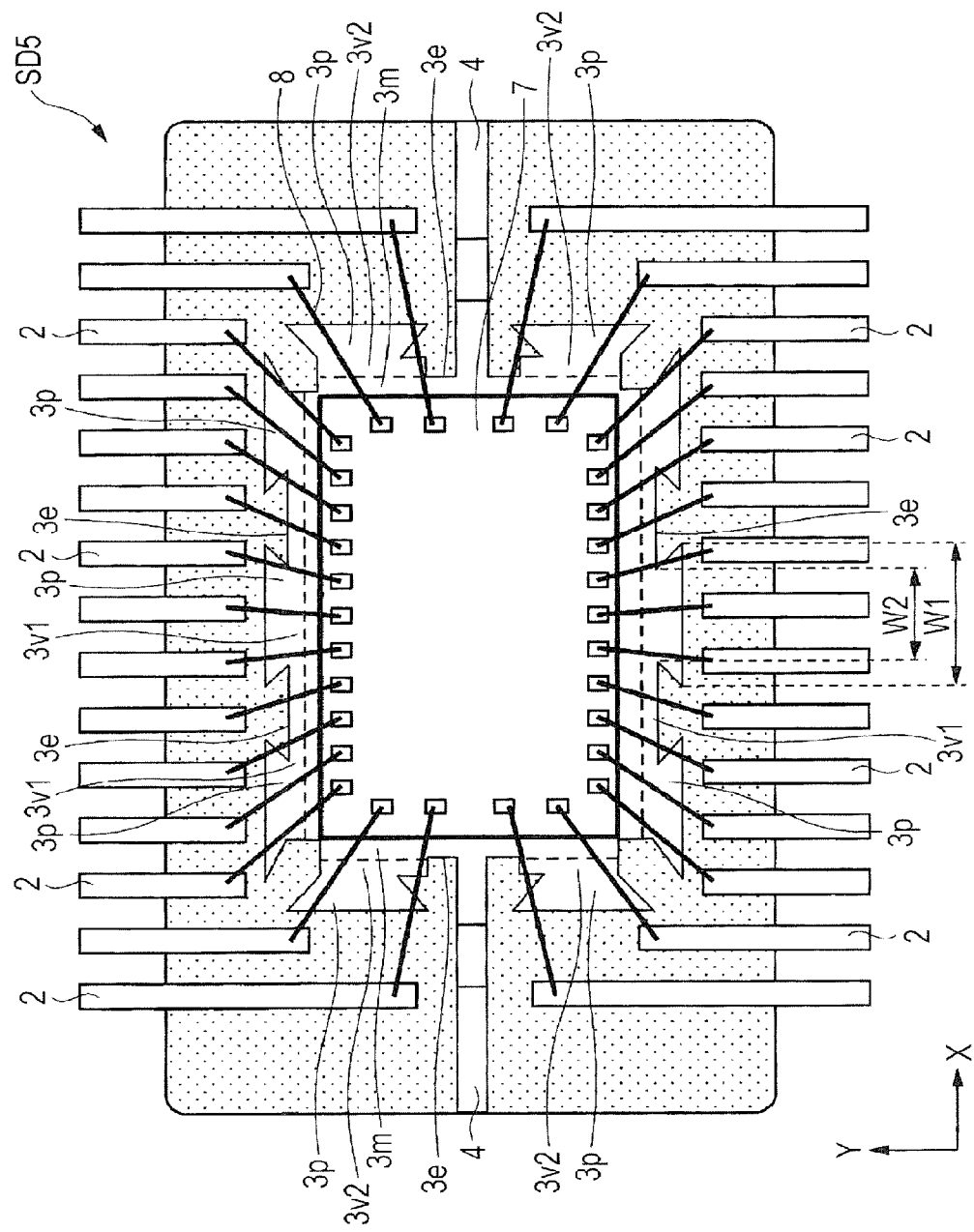
FIG. 15 is a plan view illustrating one example of a semiconductor device according to a second altered example.

FIG. 15 is a plan view illustrating one example of a semiconductor device according to the second altered example. The second altered example is an altered example of the fourth embodiment and is an altered example of the die pad. Other parts are same as those in the first embodiment and the same numerals as those in the first embodiment are assigned to the parts. Incidentally, illustration of the coupling wires 8 to be installed under the semiconductor chip 7 is omitted.

As illustrated in FIG. 15, a semiconductor device SD5 according to the second altered example includes a die pad 34 configured by the chip mounting region 3m and the bent parts 3v1 and 3v2. In FIG. 15, a region that is surrounded with a broken line is the chip mounting region 3m. The chip mounting region 3m is the rectangular oblong region in planer view and has the external form that is larger than the semiconductor 7 to be mounted thereon in the X and Y directions.

The bent parts 3v1 and 3v2 are provided respectively along the long sides and the short sides of the chip mounting region 3m. The plurality of concave parts 3e are respectively provided in the bent parts 3v1 and 3v2 and a plurality of convex parts 3p are respectively provided on the tips of the bent parts 3v1 and 3v2. A width (W1) of the tip (the side away from the semiconductor chip 7) of each convex part 3p is wider (W1>W2) than a width (W2) on the inner side (the side closer to the semiconductor chip 7) of each convex part 3p. On the other hand, a width of the tip of each concave part 3e is narrower than a width on the inner side of each concave part 3e and the sealing resin is charged into each concave part 3e.

The anchor effect is increased with the aid of the shapes of the concave parts 3e and the convex parts 3p so formed and thereby it is possible to reduce the thermal expansion and contraction of the die pad 34.

Although in the second altered example, the semiconductor device SD5 has a structure that each concave part 3e does not reach the chip mounting region 3m, the semiconductor device SD5 may have a structure that each concave part 3e reaches the chip mounting region 3m. In either case, it is favorable that each concave part 3e between each suspension lead 4 and each convex part 3p reach the chip mounting region 3m.

Although, as mentioned above, the invention that has been made by the inventors and others of the present application has been specifically described on the basis of the preferred embodiments thereof, it is needless to say that the present invention is not limited to the aforementioned embodiments and may be altered and modified in a variety of ways within a range not deviating from the gist thereof. For example, although the above-mentioned embodiments have been described by using the SOP type semiconductor device, the present invention is also applicable to a QFP (Quad Flat Package) type semiconductor device.

What is claimed is:

1. A semiconductor device comprising:
   a die pad that includes:
      a first upper surface including a chip mounting region and a first bent part, and
      a first lower surface located on an opposite side from the first upper surface;
   a semiconductor chip that is mounted in the chip mounting region and includes:
      a second upper surface,
      a second lower surface located on an opposite side from the second upper surface, and
      an electrode formed over the second upper surface;
   a sealing body that includes a third upper surface and a third lower surface located on an opposite side from the third upper surface, and that seals the semiconductor chip and the first upper surface of the die pad;
   a lead having a first portion that is located in the sealing body and a second portion that is located outside the sealing body; and
   a wire that is located in the sealing body and connects the electrode of the semiconductor chip and the first portion of the lead,
   wherein the first lower surface of the die pad is exposed from the third lower surface of the sealing body,
   wherein the first bent part is located in the sealing body,
   wherein the first bent part extends from the chip mounting region in a first direction,
   wherein the electrode of the semiconductor chip and the first portion of the lead are connected by reverse bonding,
   wherein a ball part of one end of the wire is connected to the lead and the other end of the wire is connected to an electrode via a bump electrode and
   wherein a thickness of the semiconductor chip is larger than a sum of a thickness of the chip mounting region and a thickness from the second upper surface of the semiconductor chip to the third upper surface of the sealing body.

2. The semiconductor device according to claim 1,
   wherein the lead extends in the first direction in planar view,
   wherein the die pad includes a second bent part that extends from the chip mounting region in a second direction that is orthogonal to the first direction,
   wherein the second bent part is located in the sealing body, and
   wherein the first bent part and the second bent part are separated by a first concave part that reaches the chip mounting region.

3. The semiconductor device according to claim 2,
   a suspension lead that extends from the chip mounting region in the second direction,
   wherein the second bent part and the suspension lead are separated by a second concave part that reaches the chip mounting region.

4. The semiconductor device according to claim 1,
   wherein the first bent part includes a first convex part and a second convex part that protrude from the chip mounting region in the first direction.

5. The semiconductor device according to claim 4,
   wherein a third concave part is arranged between the first convex part and the second convex part, and
   wherein the third concave part reaches the chip mounting region.

6. The semiconductor device according to claim 4,
   wherein a width of the first convex part at a side closer to the chip mounting region is narrower than a width of the first convex part at a side farther from the chip mounting region.

7. The semiconductor device according to claim 1,
   wherein the die pad includes a flat part that continuously extends from the first bent part in the first direction, and
   wherein the flat part extends in a direction that is parallel with the third lower surface.

8. The semiconductor device according to claim 7,
   wherein a slit that extends from the first upper surface and reaches the first lower surface is formed in the flat part.

9. A manufacturing method for a semiconductor device, the method comprising:
   (a) preparing a lead frame comprised of copper and including:
      a chip mounting portion, which includes a first upper surface and a first lower surface located on an opposite side from the first upper surface; and
      a lead;
   (b) mounting over the chip mounting portion a semiconductor chip, which includes a second upper surface with an electrode and a second lower surface located on an opposite side from the second upper surface, such that the second lower surface and the first upper surface face each other;
   (c) connecting the lead and the electrode of the semiconductor chip by a wire that is comprised of copper; and
   (d) sealing a part of the lead, a part of the chip mounting portion, the semiconductor chip, and the wire with a sealing resin that has been heated and melted, and forming a sealing body,
   wherein the sealing body includes a third upper surface and a third lower surface located on an opposite side from the third upper surface,
   wherein the first lower surface of the chip mounting portion is exposed from the third lower surface,
   wherein in (c), the wire is connected to the lead after having been connected to the electrode via a bump electrode, and wherein after (d), a height from the second lower surface to the second upper surface is larger than a sum of a height from the first lower surface to the first upper surface and a height from the second upper surface to the third upper surface.

10. The manufacturing method for the semiconductor device according to claim 9,
wherein the lead extends toward the chip mounting portion in a first direction,
wherein the chip mounting portion includes a chip mounting region to which the semiconductor chip is mounted and a bent part that extends from the chip mounting region in the first direction,
wherein in (d), the first lower surface of the chip mounting portion is exposed from the sealing body, and
wherein the bent part is sealed with the sealing resin.

11. The manufacturing method for the semiconductor device according to claim 9,
wherein in (a), the lead frame is prepared such that a thickness of the chip mounting portion is thinner than a thickness of the lead.

* * * * *